United States Patent
Gard et al.

[11] Patent Number: 5,850,624
[45] Date of Patent: Dec. 15, 1998

[54] ELECTRONIC COMPASS

[75] Inventors: Michael F. Gard; Jian Jin, both of Perry; John C. Wisehart, Stillwater, all of Okla.

[73] Assignee: The Charles Machine Works, Inc., Perry, Okla.

[21] Appl. No.: 544,940

[22] Filed: Oct. 18, 1995

[51] Int. Cl.⁶ .................................................. G01C 17/38
[52] U.S. Cl. ........................... 702/92; 702/94; 702/150; 33/356; 33/361
[58] Field of Search ........................ 364/559, 453, 364/571.03, 571.06; 33/355 R, 361, 324, 304, 356, 302, 313, 312, 301; 74/5 R–5 F, 5.46, 5.9, 5.7, 5.8; 73/151; 702/92, 94, 150

[56] References Cited

U.S. PATENT DOCUMENTS

| | | | |
|---|---|---|---|
| 4,533,872 | 8/1985 | Boord et al. | 324/252 |
| 4,597,454 | 7/1986 | Schoeffler | 175/61 |
| 4,622,843 | 11/1986 | Hormel | 73/1 E |
| 4,640,016 | 2/1987 | Tanner et al. | 33/356 |
| 4,709,486 | 12/1987 | Walters | 33/304 |
| 4,715,452 | 12/1987 | Sheppard | 175/61 |
| 4,732,223 | 3/1988 | Schoeffler et al. | 175/73 |
| 4,782,453 | 11/1988 | Bauer et al. | 364/559 |
| 4,797,822 | 1/1989 | Peters | 364/422 |
| 4,807,462 | 2/1989 | Al-Attar | 73/1 E |
| 4,813,274 | 3/1989 | DiPersio et al. | 73/151 |
| 4,849,696 | 7/1989 | Brun et al. | 324/252 |
| 4,918,824 | 4/1990 | Farrar | 33/361 |
| 4,933,640 | 6/1990 | Kuckes | 324/339 |
| 4,989,333 | 2/1991 | Helldorfer et al. | 33/356 |
| 5,021,962 | 6/1991 | Helldorfer et al. | 364/457 |
| 5,046,260 | 9/1991 | Wellhausen | 33/356 |
| 5,090,231 | 2/1992 | Gallagher | 73/1 E |
| 5,128,867 | 7/1992 | Helm | 364/422 |
| 5,161,311 | 11/1992 | Esmer et al. | 33/356 |
| 5,163,520 | 11/1992 | Gibson et al. | 175/19 |
| 5,170,566 | 12/1992 | Fowler et al. | 33/356 |
| 5,172,480 | 12/1992 | Labuc et al. | 33/304 |
| 5,175,936 | 1/1993 | Sato | 33/354 |
| 5,199,178 | 4/1993 | Tong et al. | 33/361 |
| 5,213,168 | 5/1993 | Warren et al. | 175/61 |
| 5,216,816 | 6/1993 | Ida | 33/356 |
| 5,218,301 | 6/1993 | Kuckes | 324/346 |
| 5,231,355 | 7/1993 | Rider et al. | 324/326 |
| 5,240,350 | 8/1993 | Yamaguchi et al. | 405/143 |
| 5,247,278 | 9/1993 | Pant et al. | 338/32 R |
| 5,255,442 | 10/1993 | Schierbeek et al. | 33/361 |
| 5,297,063 | 3/1994 | Cage | 364/571.02 |
| 5,297,065 | 3/1994 | Cage et al. | 364/571.05 |
| 5,314,030 | 5/1994 | Peterson et al. | 175/26 |
| 5,323,336 | 6/1994 | Cage | 364/574 |
| 5,351,204 | 9/1994 | Al-Attar | 364/571.03 |
| 5,394,029 | 2/1995 | Gay et al. | 327/511 |
| 5,519,318 | 5/1996 | Koerner et al. | 324/252 |
| 5,525,901 | 6/1996 | Clymer et al. | 324/207.21 |
| 5,546,310 | 8/1996 | Ehdaie et al. | 364/449 |

OTHER PUBLICATIONS

Crossbow "Preliminary Data CXLSD Series Small Diameter Accelerometers" data sheets, five pages, (undated).

Honeywell "Magnetic Sensor Products" data sheets, four pages (Oct. 1996).

"Semiconductor Sensors, General—magnetic field sensors", Philips Semiconductors, Jun. 1992.

"Magnetic field sensor" product specification, Philips Semiconductors, Jul. 1992.

*Primary Examiner*—John E. Barlow, Jr.
*Assistant Examiner*—Hien Vo
*Attorney, Agent, or Firm*—Sidley & Austin

[57] ABSTRACT

An electronic compass (10) for use in a boring tool (12) which will provide an orientation of the boring tool relative to the earth's magnetic field. In addition, a more straightforward left or right deviation from an initial bearing can be determined. The invention can correct for pitch angle and roll angle variation as well. The magnetic field is sensed by an axial magnetic field (12), a radial magnetic field sensor (18) and a plane-normal magnetic sensor (24) which are preferably magnetoresistive sensors.

74 Claims, 6 Drawing Sheets

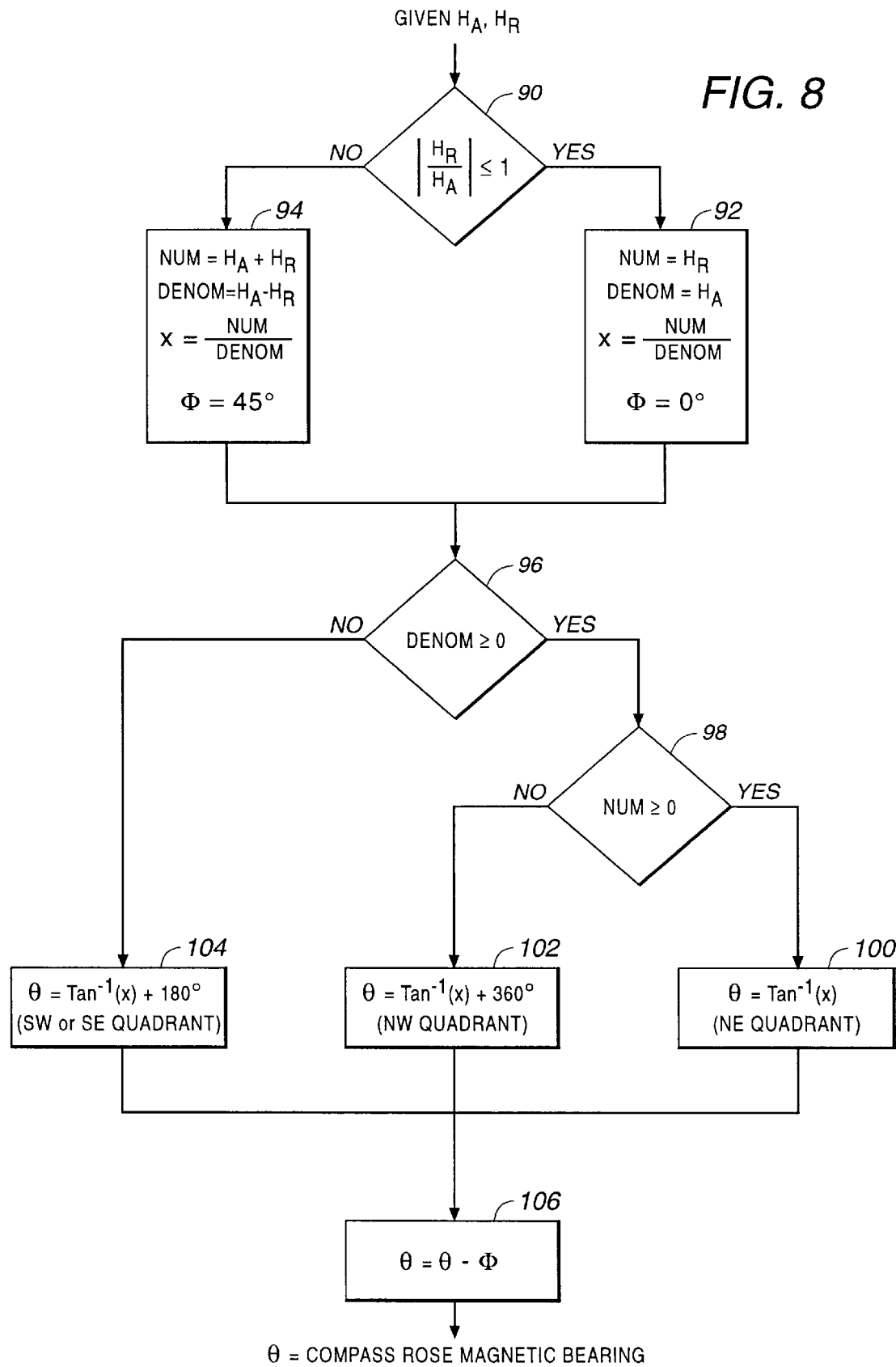

ELECTRONIC COMPASS

TECHNICAL FIELD OF THE INVENTION

This invention relates to apparatus and methods for determining the directional bearing for movable apparatus, such as a subsurface boring tool.

BACKGROUND OF THE INVENTION

Compasses of many types have long been utilized to determine the direction that a vehicle, such as an automobile, airplane or ship, is traveling. Depending on the degree of precision required, the cost and complexity of compasses vary over a wide range. Mechanical and electromechanical compasses, especially those utilized in aircraft, employ gyroscopes to provide a display of directional bearing. Vehicles and apparatus utilized to transport passengers and cargo presently utilize a compass to determine the direction of travel. U.S. Pat. No. 5,255,442 by Schierbeek et al., discloses a processor controlled electronic two-axis compass utilizing magnetoresistive sensors to sense the horizontal components of the earth's magnetic field to provide directional bearing information. This patent specifically addresses a technique for compensating for errors generated by the vehicle steel frame and electrical wiring. U.S. Pat. No. 4,918,824 by Farrar discloses an electronic digital compass utilizing magnetostrictive cores to provide a three-axis compass to resolve the magnetic field of the earth into X, Y and Z axis components. Pitch and roll sensors are suggested to be used for use in a three axis coordinate rotation to determine what the horizontal magnetic field components would be if the vehicle was in a horizontal plane. U.S. Pat. No. 5,161,311 by Esmer et al., discloses a technique for the calibration and compensation of an electronic compass of the type using flux gate magnetic sensors. In a variation of the foregoing, U.S. Pat. No. 5,046,260 by Wellhausen, discloses the use of three magnetoresistive sensors, each disposed at 120° with respect to each other in a plane. In this manner, the electronic compass is made more immune to the effects of errors based on variations in the signal amplification and improves the accuracy of measurements.

Another application of magnetic field detectors is in underground boring tools, which are driven to form a bore for the placement of utility pipes, wires, etc. therein. Activities described as directional drilling, subsurface boring, microtunneling and the like share the objective of producing a hole beneath the surface of the earth in a carefully controlled manner. The hole is usually required for installation of tubular members such as pipes (for natural gas, petroleum fluids, steam, water, other gases and liquids, slurries, or sewer connections), protective conduits (for subsequent installation of electrical wires, cable television lines, or fiber optic cable), for direct burial of electrical wires and fiber optic cable and the like. All such activities, particularly those in the topmost 100 feet or so of the surface, are described as subsurface boring.

Subsurface boring is increasingly important because it allows rapid placement of gas and water lines, sewers, electrical service, cable television service, and similar utility connections with minimal disturbance of roads, landscaping, buildings, and other surface features. Subsurface boring allows placement of pipe and utility connections where conventional surface installation by trenching is impractical or impossible as, for example, when utility connections must cross rivers, canals, major highways or rail lines. Significant practical and economic advantages are derived from the ability to provide pipe and utility connections with minimal surface disturbance or to provide subsurface crossing of surface barriers.

Steering and navigating the boring tool are problems that must be solved to realize all advantages of subsurface boring. Risks are associated with subsurface boring in developed areas having previously buried utility connections. It is clearly essential that the boring tool maintain the intended path to avoid preexisting impediments or installations. Accordingly, any improved mechanism of steering and directing boring equipment is significant. Those familiar with the art recognize that a reliable and inexpensive mechanism for steering and navigation has not yet been made available for subsurface boring operations. As boring is primarily in a generally horizontal direction, the steering and navigation technique is concerned primarily with a) bearing or azimuth which defines the horizontal direction of travel of the boring tool relative to a reference, such as north; b) pitch, which is the angle of the boring tool for moving either deeper into the ground or toward the surface; and c) roll, which is the angular rotation of the boring tool to perform the boring operation, and in some circumstances to perform a steering function.

The petroleum industry has been interested in directional drilling for many years. The drill path for petroleum industry applications may be either vertical or horizontal and often extends tens of thousands of feet. The required precision has led the petroleum industry to focus on relatively sophisticated and expensive technologies involving such developments as laser gyroscopes and other inertial guidance packages, accelerometer-based instrumentation and fluxgate magnetometers. For example, U.S. Pat. No. 4,797,822 by Peters describes a complicated and expensive inertial navigation arrangement using a gyrocluster and accelerometers to determine the path length of the downhole tool with respect to the surface opening of the borehole. A processor transforms the coordinate system of the downhole tool to the coordinate system associated with the earth to correct for temperature, centrifugal acceleration, Coriolis effect, etc. As can be appreciated, these technologies have been applied to subsurface boring applications, but the costs are substantial. The relative sizes of tubular drill string equipment for oil field drilling and subsurface boring are different, with subsurface boring tubular equipment ordinarily being of smaller diameter. Adaption of oil field directional drilling technologies has met with limited success because they are, by subsurface boring standards, far too expensive and too large.

From the foregoing, a need therefore exists for a reliable, accurate and inexpensive electronic compass that is well suited for vehicles, as well as subsurface boring equipment. A further need exists for an economical electronic compass where the effects of a nonzero pitch angle are removed to thereby enhance the accuracy thereof. An attendant need exists for an electronic compass that operates in an environment of continuous rotation, but which nevertheless must provide directional bearing information that is independent of the roll angle. Yet another need exists for an electronic compass which is capable of providing accurate lateral errors or bearing deviation of an actual path of travel, as compared with an intended path. Among other needs, there is also a need for maximizing accuracy of an electronic compass which do not employ expensive floating point processors, by utilizing algorithms easily accommodated by less costly microprocessors.

SUMMARY OF THE INVENTION

In accordance with one aspect of the present invention, an electronic compass is provided for use in general navigational applications to determine directional bearing relative to the earth's magnetic field. The electronic compass is capable of providing correct magnetic bearing information even while experiencing rotation about various axes defined by pitch and roll. The electronic compass includes an axial magnetic sensor oriented with respect to the forward direction of the object or vehicle (e.g., automobile, truck, marine vessel, or aircraft) in which it is installed, a radial magnetic sensor mounted to detect the magnetic field strength along a radial line perpendicular to the axial direction (often assumed to be coplanar with the axial sensor in a generally horizontal plane), and a plane-normal magnetic sensor mounted to detect the magnetic field strength along a line normal to the plane defined by the axial and radial sensors. A mechanism and technique is provided for analyzing the measured magnetic field strength sensed by the axial, radial, and plane-normal magnetic sensors to accurately determine the directional bearing of the object or vehicle.

In accordance with another aspect of the present invention, the electronic compass is provided for specific use in a boring tool to determine the directional bearing of the boring tool relative to the earth's magnetic field, even while the boring tool experiences rotation about various axes defined by pitch and roll. The electronic compass includes an axial magnetic sensor mounted in the boring tool to detect the magnetic field strength along the forward direction of the boring tool, which may also be an axis of rotation, a radial magnetic sensor mounted in the boring tool to detect the magnetic field strength along a radial line perpendicular to the axial sensor, and a plane-normal magnetic sensor mounted to detect the magnetic field strength along a line normal to the plane defined by the axial and radial sensors. A mechanism and technique is provided for analyzing the measured magnetic field strength sensed by the axial, radial, and plane-normal magnetic sensors to accurately determine the directional bearing of the boring tool.

In accordance with another aspect of the present invention utilized in a substantially horizontal plane, a method for orientation relative to the earth's magnetic field includes the steps of measuring the axial magnetic field and measuring the magnetic field along a radial line perpendicular to and coplanar with the axial direction. The method further includes the step of calculating the angle of orientation relative to magnetic north by taking the arctangent of the ratio of the radial magnetic field component to the axial magnetic field component—which calculation may involve coordinate system rotation for algorithmic simplicity—and suitably modifying the arctangent result to emulate the bearing indication of a conventional compass.

In accordance with yet another aspect of the present invention, the measurement plane is simultaneously rotated about both the axial and radial directions, resulting in a measurement plane in which the axial direction has nonzero inclination with respect to a horizontal reference, while the radial direction is rotated with respect to the horizontal reference. A method is provided for mathematically correcting (reprojecting) the axial and radial sensor readings to obtain the readings which would have been obtained in the horizontal reference plane, allowing bearing calculations to be carried out in a consistent reference plane for the purpose of reducing bearing calculation errors related to the pitch and roll of the measurement plane. The method further includes the steps of measuring pitch, roll, and the plane-normal magnetic field components, calculating the angle of orientation relative to magnetic north by taking the arctangent of the ratio of the radial magnetic field component to the axial magnetic field component—which calculation may involve coordinate system rotation for algorithmic simplicity—and suitably modifying the arctangent result to emulate the bearing indication of a conventional compass.

According to yet another aspect of the present invention, the measurement plane is rotated about a horizontal radial axis to produce pitch, resulting in a measurement plane which is substantially a special case of the method in which the roll angle is zero; the axial direction is inclined with respect to the horizontal while the radial direction is parallel to the horizontal. A method is provided for mathematically correcting (reprojecting) the axial and radial sensor readings to obtain the readings which would have been obtained in the horizontal plane, allowing bearing calculations to be carried out in a consistent reference plane for the purpose of reducing bearing calculation errors related to the pitch of the measurement plane. The method further includes the steps of measuring the pitch and the plane-normal magnetic field component, calculating the angle of orientation relative to magnetic north by taking the arctangent of the ratio of the radial magnetic field component to the axial magnetic field component—which calculation may involve coordinate system rotation for algorithmic simplicity—and suitably modifying the arctangent result to emulate the bearing indication of a conventional compass.

It is understood that even yet another aspect of the present invention in which the measurement plane is rotated about a horizontal axial direction to produce roll, resulting in a measurement plane in which the axial direction has zero inclination with respect to a horizontal reference, while the radial direction is rotated with respect to the horizontal reference, is substantially a special case of the method in which the pitch angle is zero. Using the method with zero pitch, the method provides for mathematically correcting (reprojecting) the axial and radial sensor readings to obtain the readings which would have been obtained in the horizontal plane, allowing bearing calculations to be carried out in a consistent reference plane for the purpose of reducing bearing calculation errors related to the roll of the measurement plane. The method further includes the steps of measuring roll and the plane-normal magnetic field component, calculating the angle of orientation relative to magnetic north by taking the arctangent of the ratio of the radial magnetic field component to the axial magnetic field component—which calculation may involve coordinate system rotation for algorithmic simplicity—and suitably modifying the arctangent result to emulate the bearing indication of a conventional compass.

In respect to yet another feature of the method, angular deviation from a predetermined desired bearing can be determined directly without processing through the intermediate step of determining magnetic (compass) bearing with respect to magnetic north. The method further includes the step of calculating the bearing deviation relative to the predetermined (desired) bearing by taking the arctangent of the ratio of factors combining predetermined (desired) and current (actual) axial and radial magnetic field readings. In the case of either nonzero pitch or nonzero roll, or both, the predetermined (desired) and current (actual) axial and radial magnetic field readings may first be corrected to a consistent reference plane by methods described herein.

In respect to yet another feature of the method, serious practical limitations of currently available sensors are overcome by combinations of electronic hardware and software which correct for nonideal behaviors of the various magnetic field sensors which, if uncorrected, would contribute substantial error to angular calculations.

In respect to yet another feature of the method, cumulative lateral accuracy is related to the accumulation (addition) of bearing deviations as measured periodically during operation of the vehicle or object. This information is provided by either computational hardware or software to present the vehicle or object operator with current information informing him/her not only of the current bearing or bearing deviation, but also of accumulated bearing error contributing to lateral error at the destination or, in the specific case of subsurface boring operations, the exit point of the boring tool.

In respect to still yet another feature of the method, angular calculation of bearing and bearing deviation can be determined with improved accuracy using finite precision computational elements by careful sorting of the data followed by arcsine or arccosine calculations, rather than arctangent calculations. In the case of either nonzero pitch or nonzero roll, or both, the axial and radial magnetic field readings may first be corrected to a consistent reference plane by methods disclosed herein.

BRIEF DESCRIPTION OF THE DRAWINGS

For a more complete understanding of the present invention, and the advantages thereof, reference is now made to the following description taken in conjunction with the accompanying drawings, in which:

FIG. 8 is a flow chart of the logic decisions employed in determining whether to use the rotated coordinate system and to convert angles for use with a compass rose;

DETAILED DESCRIPTION OF THE INVENTION

Figure 1:
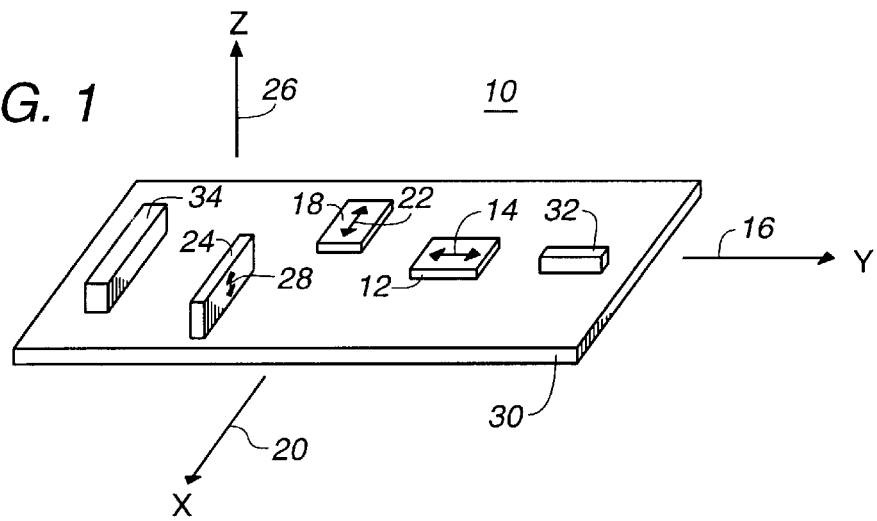
FIG. 1 is an isometric view of an electronic compass constructed according to the invention.

With reference now to the accompanying drawings, an electronic compass is described for use in orienting an object or vehicle relative to the earth's magnetic field. Liquid-filled and needle-bearing card compasses are still widely used for automotive, marine, and aircraft applications. In high-precision applications, the earth's magnetic field is most often measured by magnetometers. Size, power consumption, and overall accuracy remain major concerns with magnetometers. By itself, a three-axis magnetometer is only a device which measures the earth's magnetic field, typically in three-dimensional Cartesian space. The user still has the problem of transforming these measurements into meaningful bearing information. This transformation is not a trivial problem. For example, rudimentary electronic compass modules for automotive applications are reported to come in two configurations. A first automotive display is an octant presentation providing directional bearing indications by compass octant (e.g., NW, N, NE, E, etc.). A second type of automotive display is a more conventional compass which displays bearing information with variable resolution and accuracy. Calibration procedures can nevertheless require elaborate procedures. The latter compass type, and possibly the former, is useful when the object or vehicle is level, but accumulates error when traveling uphill or downhill—for reasons which are fully appreciated and which will be discussed below. The preferred embodiment described herein specifically overcomes the restriction of requiring straight-and-level motion to maintain accuracy, and permits operation without elaborate calibration or initialization sequences by the user.

Fluxgate magnetometers are well known and can also be used to measure the earth's magnetic field. Such devices are widely used in general navigational, instrumentation, and measurement applications; they have been employed in oil field directional drilling technologies and have been applied to subsurface boring with some degree of success. Unfortunately, fluxgate magnetometers are usually expensive, require relatively high power, and are often relatively large by subsurface boring standards. Thus, fluxgate magnetometers are not well adapted for use with relatively small boring tools that are subject to mechanical abuse, frequent loss, and unrepairable damage. Physical constraints, electrical power constraints, and the likelihood of loss or damage significantly reduce the attractiveness of expensive magnetometers.

The earth's magnetic field may also be measured using solid state Hall effect sensors. The Hall effect phenomenon describes a potential difference produced by the effect of a magnetic field on charge carriers in a current-carrying semiconductor device. Hall effect sensors are widely used in a variety of industrial applications, but only a few commercial devices have the requisite sensitivity to measure the earth's relatively weak magnetic field. The earth's magnetic field is typically somewhat less than one Gauss or 100 microTesla. Hall effect devices having the required sensitivity are expensive and require relatively high power. For this reason, Hall effect devices are not well suited for use in a limited-power boring tool subject to mechanical abuse, damage, and loss.

A relatively new class of magnetic field sensors exploiting the phenomena of magnetoresistance is now available. In magnetoresistive devices, a magnetic field changes the electrical resistance of a current-carrying magnetic material. The material is often a permalloy material, e.g., a ferromagnetic alloy containing about 20% iron and about 80% nickel. Magnetoresistive sensors of suitable types are identified as model KMZ10A1 and KMZ51 sensors manufactured and sold by Philips Semiconductors; still others of similar construction and operation are manufactured by Honeywell, by Non-Volatile Electronics, and by Space Electronics Incorporated. These sensors are arranged in a Wheatstone bridge configuration such that an external magnetic field impressed across the sensitive axis of the sensor element influences the branch resistances in the Wheatstone bridge. The amount of imbalance is determined by both the strength and direction of the magnetic field. Thus, the magnetoresistive sensor produces an output signal proportional to the magnetic field vector projection on the sensitive axis thereof. These sensors present certain difficulties in use, as described hereinafter, but the sensors have the advantages of being inexpensive, require relatively little power, are characterized by rugged construction, and are small enough to fit within a compact space. The use of the Philips KMZ51 sensor will be assumed in the remainder of this specification.

A generalized electronic compass 10, illustrated in FIG. 1, includes an axial magnetic sensor 12 whose sensitive axis 14 is oriented in alignment with respect to the forward direction 16 of the object or vehicle (e.g., automobile, truck, marine vessel, or aircraft) in which it is installed. In the example, the forward direction of travel coincides with the y-axis of the Cartesian coordinate system. A radial magnetic sensor 18 is mounted to detect the magnetic field strength along a radial line 20 perpendicular to the axial direction 16 (the axial-radial axes are ordinarily assumed to define a generally horizontal plane). The axis of sensitivity 22 of the radial magnetic sensor 18 is in alignment with the radial line 20. A plane-normal sensor 24 is mounted to detect the magnetic field component along a line 26 normal to the plane defined by the axial and radial sensors 12 and 18. The axis of sensitivity 28 of the plane-normal sensor 24 is in alignment with the z-axis 26, which is normal to the plane in which the y-axis 16 and x-axis 20 lie. These sensors and associated electronic components are conventionally mounted on a circuit board 30 which is, in most cases, a rigid planar structure. Sensors 12, 18, and 24 are assumed to be of the KMZ51 magnetoresistive type, as noted above. Because the axial and radial magnetic sensor response axes 14 and 22 define a plane, it is convenient to associate the plane of the axial and radial magnetic sensor response axes with the physical plane associated with the circuit board 30. Accordingly, the plane-normal sensor 24 may also be described as a board-normal sensor, as it is associated with the sensor 24 having a sensitive axis 28 perpendicular (normal) to the plane of the physical circuit board 30. The set of sensors 12, 18, and 24 therefore constitute an orthogonal trio defining a complete three-dimensional Cartesian coordinate system. Accordingly, this sensor set allows the earth's magnetic field vector to be decomposed into respective axial, radial, and plane-normal components. As will be described more fully below, a pitch sensor 32 and a roll sensor 34 can be mounted to the circuit board 30 to sense pitch and roll movements of the circuit board 30. In addition to data representing the axial, radial and plane-normal magnetic field components, data representing pitch and roll of the magnetic compass 10 are coupled to a microprocessor for processing according to the techniques and algorithms described below. Those skilled in the art can readily appreciate that the analog signals output by the various sensors can be converted to digital data by plural A/D converters, or by multiplexing a single A/D converter.

Figure 2:
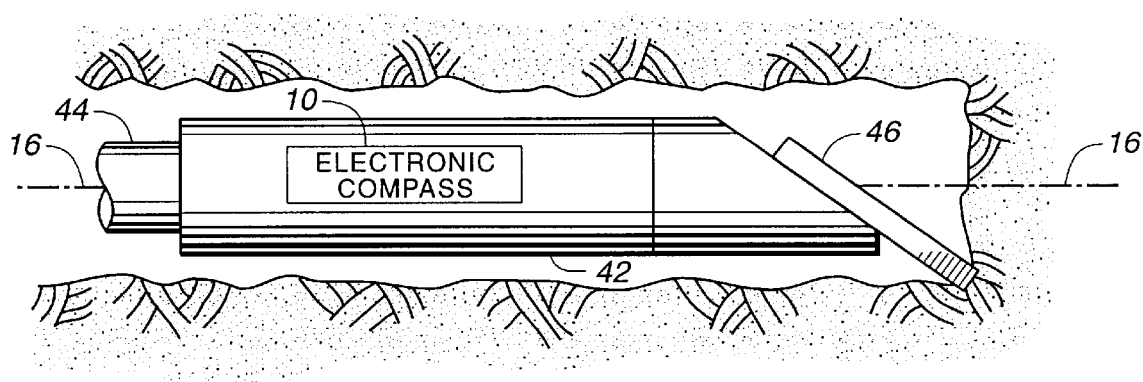
FIG. 2 is a side view of a boring tool in which a first embodiment of the present invention is utilized.
Figure 3:
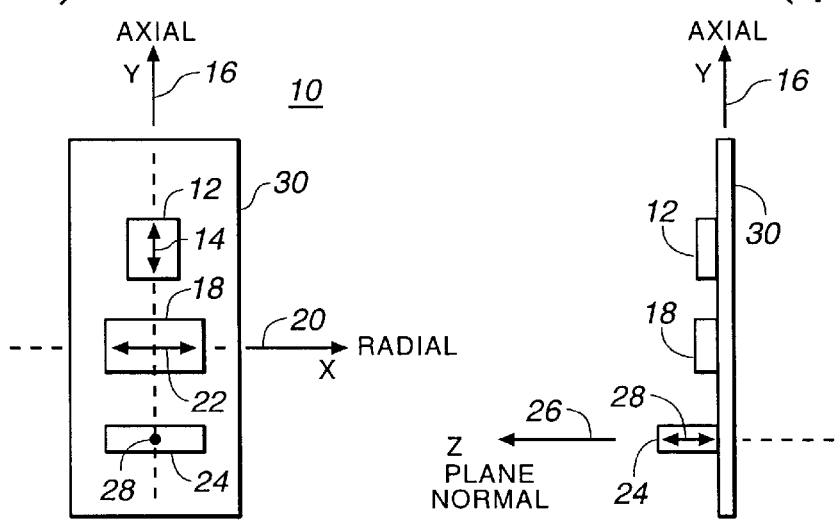
FIG. 3 is a respective top view and side view of a circuit board containing electronic components to illustrate reference directions of a compass of the first embodiment of the present invention.

With reference to FIGS. 2 and 3, the electronic compass circuit board 30 may be employed within a boring tool or other object or vehicle intended to operate while undergoing rotation about an axis of rotation. In such cases, the nomenclature remains substantially the same. The circuit board 30, included as part of the compass 10, includes the axial magnetic sensor 12, a radial magnetic sensor 18, and a plane-normal magnetic sensor 24. The circuit board 30 also includes many other electrical components, not shown. The axial magnetic sensor 12 is oriented so that the axis of rotation 16 of the boring tool lies within the sensing axis 14 of the sensor 12. The radial magnetic sensor 18 is oriented so that a radial line 20 taken perpendicular to the axis of rotation 16 lies within the sensing axis 22 of the sensor 18. The plane-normal magnetic sensor 24 is oriented so that a radial line 26 taken perpendicular to the axis of rotation 16 and the radial axis 20 lies within the sensing axis 28 of the sensor 24. As in the general vehicular case, sensors 12, 18, and 24 therefore constitute an orthogonal set defining a complete three-dimensional Cartesian coordinate system. Accordingly, this sensor set allows the earth's magnetic field vector to be decomposed into axial, radial, and plane-normal components.

As a matter of convenience and brevity, the distinction between the different types of applications will not be further delineated, as those skilled in the art will appreciate such differences from the description set forth below. It will be appreciated that the more difficult case is one in which the earth's magnetic field is to be measured from a generalized platform subject to simultaneous nonzero pitch orientations (as measured with respect to the horizontal or other reference plane), and rotation (continuous roll) or nonzero static roll orientations about an axis of rotation. Once solved in the more general case, the technology is readily adapted to more specific cases. A subsurface boring tool in a more general case, for example, is rotated at various pitch angles to penetrate the earth—and yet it is necessary to determine magnetic bearing in spite of nonzero pitch (the tool inclination) and nonzero (and possibly continuously variable) changes in roll angle about the axis of rotation. The techniques discussed hereinafter permit accurate operation of an electronic compass in this difficult general case. An automobile proceeding uphill or downhill is a simplification in that the pitch may be variable but the roll angle will be substantially constant (zero degrees with respect to horizontal). An automobile in straight-and-level motion is a further simplification in that both roll and pitch are substantially zero. The more general case is described in terms of a horizontal boring application for the sake of providing a convenient conceptual framework to illustrate the invention—it being realized that the invention is not to be construed to be applicable only to underground boring operations.

In one particularly illustrative example, the electronic compass 10 may be described for use in orienting an underground boring tool 40 relative to the earth's magnetic field. As seen in FIG. 2, the boring tool 40 ordinarily includes a boring bit 42 which is at the forward end of a length of drill string 44 that extends back to the surface. A blade 46 is mounted to the boring bit 42 and functions both to assist in boring the borehole and steering the boring tool 40 within the borehole. As is well understood in the industry, rotation of the drill string 44 while pushing the drill string forward in the borehole will cause the boring bit 42 and blade 46 to form the borehole in a linear direction. If the drill string 44 rotation is stopped while continuing the forward thrust of the drill string and boring bit, the blade 46, which is angled relative to the axis of rotation 16, will deflect the boring bit 42 and permit the boring tool 40 to be steered.

As can be well appreciated, the location of the boring tool 40 is of significant interest as the borehole is being made so that small corrections can be made before the deviation from the intended path becomes unacceptably great. The position of the boring tool 40 needs to be monitored continuously to insure that the borehole is not diverted from the desired path.

As part of this information, it is desirable to determine the directional bearing of the boring tool 40 relative to a fixed and known direction, such as magnetic north. Those skilled in the art readily recognize that the magnetic north pole is different from the geographic north pole.

As will be described in greater detail hereinafter, the earth's magnetic field is employed to permit detection of the true bearing of boring tool 40. The earth's magnetic field is an acceptable large scale directional reference for steering and navigating subsurface boring tools. Determination of the directional bearing of the boring tool 40 relative to the earth's magnetic field is an attractive navigational solution as no external signal source is required. Local anomalies produced by ferromagnetic objects, such as buried pipes and tanks, etc., do influence magnetic measurements to a certain extent. In general, steering a boring tool 40 by use of the earth's magnetic field is adequate for subsurface boring operations. However, the mechanism of detection must be suitably compact in size to fit within the very small boring tool 40, must require minimal operating power, must operate over a wide temperature range, and must be inexpensive as the boring tool has relatively high probability of loss in the borehole due to mechanical drill string failures or may require frequent replacement because of the substantial mechanical abuse typical of the operating environment.

Figure 4:
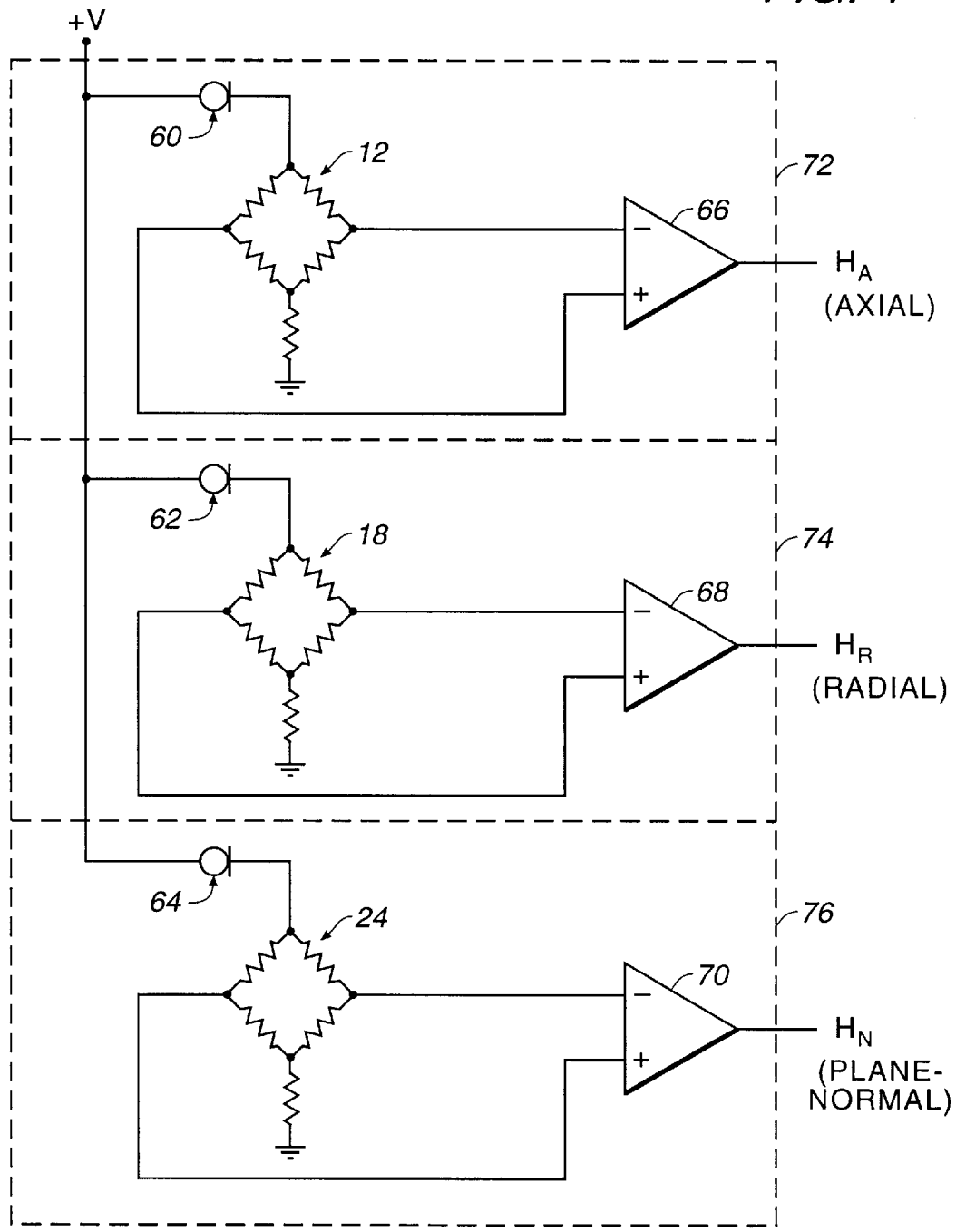
FIG. 4 is a schematic drawing of the magnetic sensors and amplifier arrangement of the present invention.

With reference to FIG. 4, the magnetoresistive sensor set and associated electronics are illustrated. In this configuration, a constant-current operating power source for bridge sensors 12, 18, and 24 is provided by the use of diodes 60, 62, and 64 which are 1N5290 type constant current diodes. The signals from each of the magnetoresistive sensors are amplified by Burr-Brown INA118 instrumentation amplifiers 66, 68, and 70. The respective magnetoresistive sensors and associated amplifiers are denoted as reference characters 72, 74 and 76, also shown in block diagram form in FIG. 5. The constant current diode bridge excitation provides a current of about 0.47 mA to each of the sensor bridges 12, 18 and 24. The constant-current bridge drive is preferred to reduce thermal drift of the sensor signal. The sensor arrangement shown in FIG. 4 utilizes a single power supply, requiring the use of a TLE2426 device or equivalent (not shown) to establish an operating reference voltage midway between the supply voltage and ground. There is a slight reduction in power consumption as a secondary benefit of constant-current operation. Diodes 60, 62 and 64 may be replaced by respective short circuits resulting in constant voltage operation. Constant current or constant voltage operation are merely two design alternatives.

Excitation of bridge sensor circuits 72, 74 and 76 can also be provided from the positive side of a bipolar (positive and negative) 5 volt direct current (±5 VDC) power supply which ultimately derives operating power from a battery set. The instrumentation amplifiers 66, 68 and 70 provide a sensor gain of about 730, or about +57 dBV, which amplification is selected to optimize the dynamic range of the amplified sensor signal with respect to an A/D converter. Instrumentation amplifiers 66, 68 and 70 are powered by the positive and negative 5 volt power supply.

Figure 5:
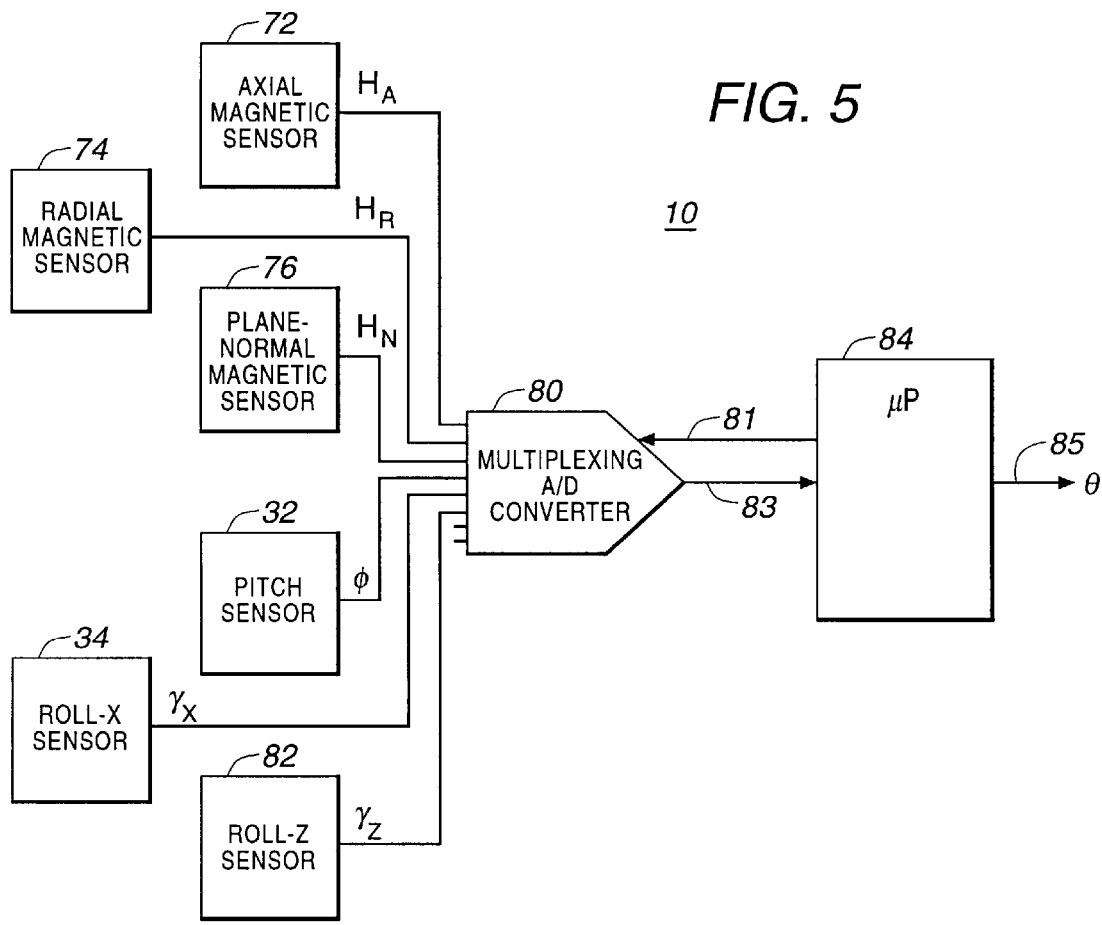
FIG. 5 is an electrical block diagram of the electronic compass of the present invention.

FIG. 5 illustrates in block diagram form the major components, modules and elements of the electronic compass 10 according to one form of the invention. In the preferred form of the invention, the components are mounted on the printed circuit board 30 which, in turn, is mounted in the equipment or vehicle for which an indication of a directional bearing or deviation is desired. The axial magnetic sensor circuit 72, the radial magnetic sensor circuit 74 and the plane-normal magnetic sensor circuit 76 have outputs coupled to respective inputs of an analog-to-digital (A/D) converter 80. The A/D converter 80 is of the twelve-bit type, model number LTC1290, obtainable from Linear Technology. This type of A/D converter is provided with eight input channels, each of which can be individually selected by a serial input 81. The magnetic component inputs $H_A$, $H_R$ and $H_N$ are analog signals generated by the respective sensors, and converted to corresponding digital signals by the A/D converter 80.

The pitch sensor 32 is also coupled to a multiplexed channel of the A/D converter 80. In the preferred form of the invention, the pitch sensor 32 is an accelerometer, obtainable from Analog Devices as model ADXL05. Rather than only a single roll angle sensor, the preferred form of the invention employs two accelerometer-type roll sensors, identified as reference characters 34 and 82. The roll angle accelerometers are of the same type as identified above in connection with the pitch sensor 32. The roll angle sensor 34 is mounted to the printed circuit board 30 in the manner shown in FIGS. 1 and 3, with its sensitive axis aligned with the roll axis x of the equipment to which it is mounted. The roll angle sensor 82, on the other hand, is mounted with its sensitive axis in the same plane as the roll axis 16, but with the sensitive axis oriented along the z-axis 26. In other words, the sensitive axes of the roll sensors 34 and 82 are orthogonal to each other and point in the respective x direction 16 and the z direction 26. The use of a pair of roll sensors 34 and 82 resolves the ambiguity of operation between the 0°–180° hemisphere and the 180°–360° degree hemisphere. As will be described more thoroughly below, the use of two roll sensors 34 and 82 also increases the sensitivity of roll angle measurements, especially when utilizing the type of accelerometers identified above. By utilizing orthogonally-oriented roll sensors, the roll sensor 34 accurately detects the 0° and 180° positions, while the roll angle sensor 82 accurately detects the 90° and 270° positions. Stated another way, the full scale output of the roll angle sensor 34 is +3.0 volt at the 0° position and is +1.0 volt at the 180° position. The other roll angle sensor 82 provides similar polarity voltages at the 90° and 270° positions. Further, because the two roll angle sensors 34 and 82 are physically oriented 90° apart, the respective analog output signals are correspondingly phased 90° apart. The simultaneous analog outputs of the roll angle sensors 34 and 82 can therefore be seen to be related as a sine wave signal and a cosine wave signal during rotation of the entire electronic compass 10 about the axial axis.

The A/D converter 80 provides a 12-bit serial output on conductor 83. A microprocessor 84 of the type MC68HC11D3, obtainable from Motorola, is programmed with the software and algorithms set forth below. Further, the microprocessor 84 includes a number of lookup tables and other types of tables for carrying out the trigonometric functions employed in the algorithmic calculations. The microprocessor 84 of the type identified above, includes internal ROM and sufficient RAM for permanently and dynamically storing data used in the calculations for determining directional bearing and/or deviation. Bearing and/or deviation data can be output by the microprocessor 84 on output 85. Indeed, the microprocessor 84 can also provide raw roll and pitch data output, based on the orientation of the pitch and roll sensors. When the electronic compass of the invention is utilized in a land vehicle, the roll sensor data can provide to the driver indications of an imminent rollover of the vehicle. In like manner, when utilized in an aircraft, the microprocessor can provide pitch data output to activate the stall warning horn when a stall is imminent. Further, the microprocessor 84 identified above is an integer-type processor, selected primarily because of its physical size, power consumption and cost. For other applications, those skilled in the art may find that other floating point type microprocessors may be advantageous for carrying out the arctangent and other trigonometric functions for determining directional bearing and/or deviation.

Figure 6:
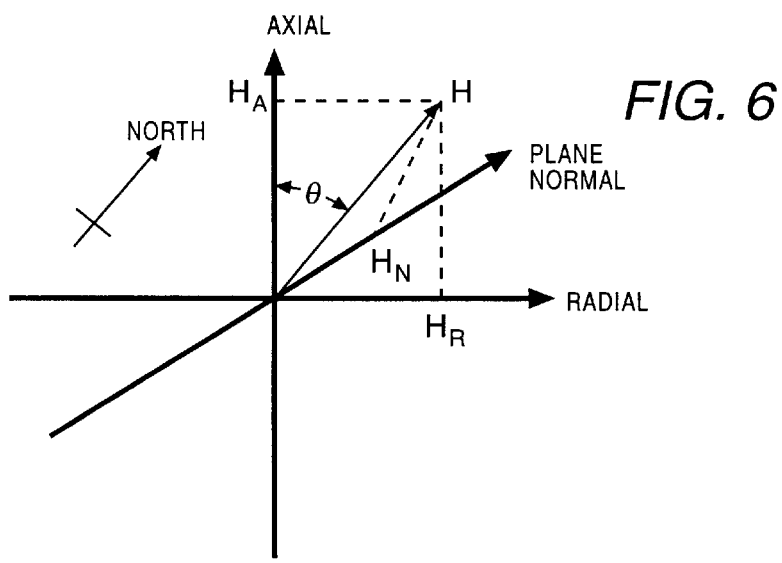
FIG. 6 is a graphical representation of a bearing angle relative to magnetic north.

With reference now to FIG. 6, the determination of direction bearing angle Θ of the boring tool 40 relative to magnetic north by using the magnetic field component sensed by the axial, radial, and plane-normal sensors 12, 18 and 24 will be discussed. The magnetic field of the earth is represented by the character H. The magnetic field components sensed by the axial, radial, and plane-normal sensors are identified as $H_A$, $H_R$, and $H_N$, respectively. The sensed magnetic field components are shown plotted on a three-dimensional Cartesian coordinate system in FIG. 6 for purposes of convenience. The earth's magnetic field H or other externally generated magnetic field is conventionally seen to be in a direction between the north and south magnetic poles. The axial sensor 12 is assumed herein to produce a maximum positive signal when the sensitive axis 14 is oriented or aligned due north, and a maximum negative signal when aligned due south. The radial sensor 18 is assumed to produce a maximum positive signal when the sensitive axis 22 is oriented or aligned due east, and a maximum negative signal when aligned due west. Thus, when the sensors 14 and 18 are oriented in a generally northeasterly orientation, they produce respective positive axial and radial magnetic components. Similarly, when the sensors 14 and 18 are oriented in a generally southwesterly orientation, they produce respective negative axial and radial magnetic field components. If the earth's magnetic field vector were truly horizontal, there would be no plane-normal component $H_N$ in a zero-roll, zero-pitch object orientation. The bearing angle Φ would then be defined with respect to the axial and radial components $H_A$ and $H_R$, with the bearing angle given by the following arctangent equation:

$$\Theta = \tan^{-1}\left(\frac{H_R}{H_A}\right). \tag{1}$$

It is recognized that the earth's magnetic field vector H is not horizontal except at the magnetic equator. However, it is sufficient to define the axial and radial components, $H_A$ and $H_R$, with respect to either a local horizontal plane or any other convenient reference plane. Deviations from the local horizontal plane may be corrected to a consistent reference plane, as described hereinafter, so that the magnetic bearing calculations described below maintain full accuracy.

The arctangent calculation of the bearing angle Θ in equation (1) is understood to provide a principal angle, that is, the angle between −90° and +90°. Conversion of the principal angle to a compass bearing requires knowledge of the relationship between individual magnetic field component polarities and the appropriate compass quadrant. By convention, a compass is divided into four quadrants. The northeast (NE) quadrant is the quadrant lying between due north and due east, or between 0° and 90°, on a compass rose. The southeast (SE) quadrant lies between due east and due south and is defined from 90° to 180° on the compass rose. The southwest (SW) quadrant lies between due south and due west, and is defined from 180° to 270°. Finally, the northwest (NW) quadrant lies between due west and due north, and is defined from 270° to 360°. Due north is recognized as either 0° or 360°, with all angles being measured in a clockwise sense on the compass rose from due north.

Figure 7:
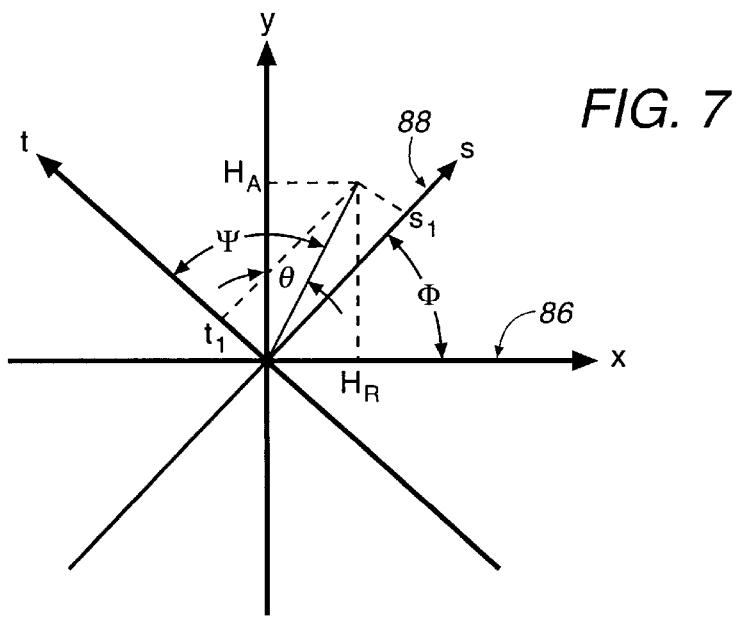
FIG. 7 is a graphical representation of a rotated coordinate system.

Common Maclaurin series expansions for the arctangent function restrict the function's argument, i.e., the ratio $H_R/H_A$, to regimes where the square of the argument is either less than unity or greater than unity. An efficient calculation of the magnetic bearing makes it desirable to maintain the principal angle satisfying equation (1) within the range between −45° and +45° to allow use of a single arctangent algorithm to compute the required arctangent. Otherwise, two separate algorithms are required, depending on whether the ratio $H_R/H_A$ is greater than unity or less than unity. The artifice of coordinate system rotation facilitates the objective of algorithmic simplicity. It is possible to define rotated coordinate axes such that the principal angle is always in the range of −45° to +45° between an original coordinate system 86 having coordinates x,y and a second coordinate system 88 having coordinates s,t. Coordinate axis rotation is accomplished by defining the second coordinate system 88 having axes s and t, as shown in FIG. 7, lying at an angle Φ (which will later be fixed at 45°) with respect to the original coordinate system 86 defined by the x and y axes, also illustrated in FIG. 7. The origins of the x,y and s,t coordinate systems are identical; there is only respective rotation at the origins, but not translation between the two coordinate systems.

As further shown in FIG. 7, the second coordinate system (s,t) 88 is rotated relative to the first coordinate system (x,y) 86 by an angle Φ. The directional bearing of the boring tool 40 in the second coordinate system (s,t) 88 is defined as the angle ψ. A general point having coordinates x and y in the first coordinate system 74 can be assigned coordinates s and t in the second coordinate system 88. The two sets of coordinates 86 and 88 are related by the equations:

$$s = x \cos \Phi + y \sin \Phi \tag{2a}$$

$$t = -x \sin \Phi + y \cos \Phi. \tag{2b}$$

Let the measured magnetic field intensity in the x–y coordinate system be ($H_R$,$H_A$); that is, x=$H_R$ and y=$H_A$. In the s–t coordinate system 88, the same measurements have coordinates ($H_R \cos \Phi + H_A \sin \Phi$, $-H_R \sin \Phi + H_A \cos \Phi$). The bearing angle ψ in the s–t coordinate system is given by:

$$\psi = \tan^{-1}\left(\frac{H_R \cos \Phi + H_A \sin \Phi}{-H_R \sin \Phi + H_A \cos \Phi}\right). \tag{3}$$

For the particular case where the angle of rotation Φ between the two coordinate systems is 45°, sin Φ and cos Φ are equal. This allows simplification of equation (3) to the equation $$\psi = \tan^{-1}\left(\frac{H_R + H_A}{-H_R + H_A}\right). \tag{4}$$

The relationship between the bearing angles and the two coordinate systems is simply ψ=Θ+Φ. The arctangent can be calculated in the more convenient coordinate system and converted to the other, if necessary, by simple addition or subtraction.

FIG. 8 is an algorithmic flow chart for this procedure that is particularly suitable for programming into a microprocessor mounted on the electronic compass circuit board 30. With reference to FIG. 8, magnetic field component sensors 12, 18, and 24 provide the respective values $H_A$, $H_R$, and $H_N$ as measured. Assuming operation in a consistent reference plane, which is nominally the local horizontal plane, decision block 90 evaluates the absolute value of the ratio $H_R/H_A$ to determine if it is less than or equal to unity. If the absolute value of the ratio $H_R/H_A$ is less than or equal to unity, the arctangent can be calculated in the first (x,y) coordinate system 86 as represented by block 92. If not, the second (s,t) coordinate system 88 is used, as illustrated in block 94.

The algorithm of FIG. 8 also converts the principal angle from the arctangent algorithm to an angle between 0° and 360° on a compass rose. The logic algorithm continues in decision block 96 to determine if the denominator is nonnegative, i.e., greater than or equal to zero. If the denominator is not negative, this indicates that the directional bearing is within the northwest or northeast quadrants, whereupon the processing then proceeds to decision block 98 to determine if the numerator is nonnegative, i.e., greater than or equal to zero. If both the numerator and denominator are positive numbers, this indicates that the bearing is in the northeast quadrant and the bearing angle 8 can be calculated directly by taking the arctangent of the argument $x=H_R/H_A$ as indicated in block 100. If the numerator is negative (less than zero) while the denominator is positive, the bearing lies within the northwest quadrant, whereupon block 102 calculates the compass bearing angle by taking the arctangent of the argument $x=H_R/H_A$ and adding 360°. If, in fact, the denominator is negative (less than zero), as determined by decision block 96, the bearing lies within either the southwest or southeast quadrants. In this instance, program flow block 104 is employed to calculate the principal angle of the argument $x=H_R/H_A$ and add 180° thereto. Finally, block 106 calculates the actual true compass rose bearing relative to magnetic north to compensate for the rotated coordinate system 88, if such system is used.

The accuracy of the magnetic bearing calculations just described is obviously dependent on the quality of magnetic field data employed in the calculation. For optimum accuracy, magnetic field measurement data must be corrected for offset errors and gain differences between the individual magnetic field component sensors 12, 18, and 24. Gain errors arise from sensitivity differences within the bridge arm elements of the sensors themselves, and also from electronic part variations in the gain determining elements of sensor amplifiers. Offset errors are static measurement errors which effectively bias the result to some constant value. Among other things, the offset errors may be caused by nonidealities in the associated amplifiers (true electronic offset) and intrinsic imbalances in the magnetoresistive sensor arms forming the Wheatstone bridge of each magnetic field sensor.

Gain correction coefficients are obtained by measuring the peak-to-peak amplitude response of individual sensors as the sensors are rotated 360° through a reference magnetic field. Because the sensor's signals are produced by the same magnetic field, the peak-to-peak signal amplitudes are indicative of sensor gain variations. Once individual sensor peak-to-peak amplitude responses are determined at the factory, individual gain correction coefficients can be calculated to normalize the responses of the three magnetic field component sensors used as axial, radial, and plane-normal sensors. The gain correction coefficient for each sensor is retained and stored in nonvolatile memory, also mounted on the circuit board 30 with the microprocessor. The gain correction factors can be stored in a look-up table, or the like, and obtained by accessing the look-up table with the actual magnetic sensor readings. The coefficients stored in conjunction with the actual readings can be multiplied together, or otherwise correlated, so that the corrected readings are used in the computational analysis to determine the directional bearing. It can be appreciated that the coefficients stored for each magnetic compass will be somewhat different, because of the various differences of the electrical characteristics of the components.

The offset error correction coefficient is obtained by rotating locally horizontal individual sensors 360° through a reference magnetic field and averaging all readings; the resulting value, i.e., the mean value, represents the offset error multiplied by the effective gain of the individual sensor. Normalization of this mean value by the gain correction coefficient produces the useful sensor offset error correction term. This offset error correction term is subtracted from each gain-corrected magnetic field measurement. The offset error correction term for each sensor is also retained and stored in the nonvolatile memory and utilized during computation of the magnetic bearing to improve accuracy.

Due to similarities in required apparatus and data, it is of practical importance to obtain gain correction coefficients and offset error correction terms during the same series of operations.

As noted above, the raw sensor measurement data must be corrected by gain correction coefficients and offset error correction terms to preserve optimum accuracy in a locally horizontal plane. In many vehicles and objects (e.g., a subsurface boring tool 40), the requirement of operation in a locally horizontal plane is a very serious restriction. When, for example, a boring tool 40 is used to produce a controlled borehole in the subsurface ground for the purpose of installing various tubular members, it is essential that the tool be capable of operating over a range of different pitch angles with respect to the local horizontal plane. Likewise the boring tool 40 is generally rotated about an axis of rotation 16 as it bores through the earth, and the roll angle any time is a random variable. Hence, for maximum utility and operational effectiveness, it is important for the electronic compass 10 to be capable of operation and providing accurate directional bearing data while boring. The electronic compass 10 will ordinarily be operated intermittently during a pause in the boring operation, but this is not an operational requirement of the technique. The invention described hereinafter is capable of reprojecting measurement data taken at arbitrary pitch and roll angles back into a local horizontal reference plane, thereby providing sufficient accuracy and repeatability to determine and display either bearing or bearing deviation from the intended bore path. The invention requires knowledge (measurement) of pitch and roll angles but does not require any particularly burdensome restrictions on pitch and roll angles.

There are many techniques to provide the required physical pitch and roll angle information. One example of a suitable device is disclosed in U.S. patent application Ser. No. 08/131,141, filed on Oct. 4, 1993, by Bieberdorf, et al., which describes a roll-independent pitch sensor 32. U.S. patent application Ser. No. 08/131,141 assumes a particular geometric orientation of the sensor 32 to provide pitch information independent of the roll angle of the boring tool 40. The same sensor may be transversely mounted on the circuit board 30 to provide roll sensor information that is independent of pitch angle. One or a plurality of conventionally available accelerometers may also be used to provide pitch and roll information. When roll position is fixed, whether by external constraints or by synchronization of the various signal events, only one pitch sensor is required.

If the axial and radial magnetic sensors 12 and 18 are oriented to define a generally horizontal reference plane, the plane-normal component can be visualized as the vector component directed more-or-less toward the center of the earth; that is, in a generally vertical orientation. The magnetic field component sensed by the axial magnetic sensor 12 in a horizontal plane is actually the earth's magnetic field vector projected onto the sensitivity axis 14 of the axial sensor 12. Similarly, the magnetic field component sensed by the radial magnetic sensor 18 in a horizontal plane is actually the earth's magnetic field vector projected onto the sensitivity axis 22 of the radial sensor 18. As the response plane defined by the axial and radial sensors 12 and 18 departs from horizontal, whether because of pitch, roll, or both, the projections of the earth's magnetic field vector onto the sensitivity axes 14 and 22 of the axial and radial magnetic sensors are dynamic in nature and change accordingly. In the event that pitch and roll orientations are not possible, or irrelevant to the particular application, only the axial magnetic sensor 12 and the radial magnetic sensor 18 are necessary.

To eliminate the effects of pitch and roll on bearing determinations, a third sensor can be employed to determine the magnetic field's plane-normal component in variable-pitch, variable-roll applications. Knowledge of the complete three-dimensional magnetic field vector plus pitch and roll angle data provides sufficient information to correct, or reproject, measurements taken at nonzero pitch and roll back into a consistent horizontal reference plane. This ability is critical to high-resolution applications where pitch and roll angles are random quantities. It will be appreciated that almost all problems involving navigation, measurement, or control with respect to a magnetic field, including the earth's magnetic field, will benefit from the ability to preserve accuracy in spite of random pitch and roll angles of the vehicle or object to which the electronic compass is fixed. Depending on the rate of change of the pitch and roll orientations of the electronic compass 10, the acquition of sensor readings and the processing thereof can be carried out dynamically, i.e., in real time. Depending also on the sophistication of the system, the processor can be programmed to sense certain orientation limits of pitch, roll or directional bearing, and provide visual or audible alarms when the limits have been exceeded. For example, if the pitch or roll angle of a vehicle exceeds a predefined limit, the electronic compass can provide the operator with an alarm to warn that the vehicle is about to roll over. In order to provide a warning of an impending roll to a land vehicle incorporating the invention, the limits of the roll angle of the vehicle must first be determined. The processor of the electronic compass will then permanently store in memory the roll angle limits of the vehicle and periodically compare the roll angle data generated by the electronic compass sensors with the roll angle limits, and provide a warning to the driver when a rollover is imminent. Indeed, a visual indicator can be illuminated when a rollover is within about 5° of the limit, and an audible alarm can be sounded when an actual rollover is about 2° of the measured roll angle. While the pitch angle of a land vehicle is not as critical as the roll angle, the same is not the case with aircraft. The pitch angle of an aircraft, especially a fixed wing type of aircraft, is of extreme importance to prevent stalling of the aircraft and loss of control. Again, when an aircraft is equipped with the electronic compass of the invention, critical pitch angles can be programmed into the processor memory and compared to the pitch angles measured by the electronic compass. When the aircraft approaches the critical pitch angle, especially in a nose high attitude, at low speeds, the stall warning horn can be activated.

The foregoing illustrates only a few examples of the practical applications of the electronic compass of the invention. In such applications, the earth's magnetic field is utilized as a reference magnetic field. However, the utilization of the present invention is not limited to use with the magnetic field of the earth, but rather can be made responsive to externally generated magnetic fields. In some applications, the earth's magnetic field is weak or generally unavailable, such as in space, in which event a magnetic field generated external to the electronic compass can be used as a primary magnetic field reference. Moreover, rather than the DC magnetic field of the earth, an externally generated AC magnetic field can be used as a magnetic field reference to the electronic compass of the invention.

As noted above, axial and radial magnetic field component measurements are pitch and roll angle dependent. Pitch and roll angle dependencies can be removed or significantly diminished by reprojecting magnetic field component measurements into a consistent reference plane, usually the local horizontal plane, before computing bearing or bearing deviation.

For clarity of understanding, the description below describes the mathematical computations of reprojecting variable-pitch, constant-roll data. Once variable-pitch, constant-roll data is reprojected onto a consistent reference plane, similar mathematical procedures can be performed to reproject the pitch-corrected measurement set to correct for variable roll. The results of the second set of operations are summarized in equation form to avoid repetition of a second mathematical development that is very similar to that for computing the variable pitch correction factor.

Two assumptions are central to the analysis of the constant-roll, variable-pitch case. First, magnetic field measurement data provided by the three sensors 12, 18 and 24 are assumed to be one-dimensional. Secondly, the analysis assumes for the time being that measurement data are taken at a consistent roll angle. Under these assumptions, three orthogonal measurements and the pitch angle are sufficient to reproject measurement data into a consistent reference plane. As noted, the axial reading is insensitive to roll angle, whereas the radial reading is strongly affected by the roll angle of the magnetic compass 10. Thus, optimal accuracy requires a consistent roll angle.

Figure 9:
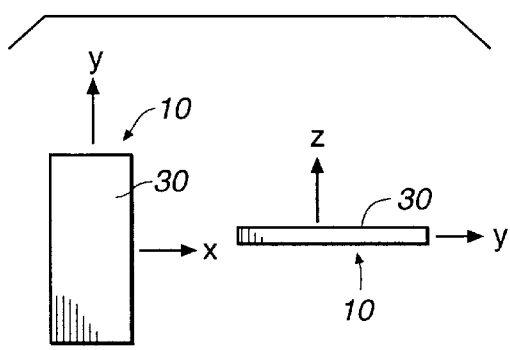
FIG. 9 is an illustrative view of the orientation of the electronic compass with zero pitch.
Figure 10:
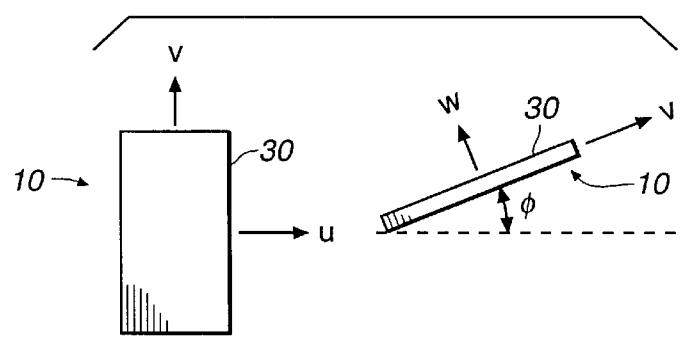
FIG. 10 is an illustrative view of the electronic compass oriented with a pitch angle.

With reference to FIGS. 9 and 10, there is illustrated the coordinate systems used in the following analysis. The circuit board 30 to which the measurement apparatus is fixed is shown in top and profile views to illustrate the relationship between various coordinate axes and the pitch angle of the electronic compass 10. FIG. 9 illustrates the circuit board 30 in a horizontal plane ($\Phi=0°$ pitch, $\gamma=0°$ roll); the associated unit vectors of the corresponding Cartesian coordinate system are shown as $\bar{x}$ (radial component), $\bar{y}$ (axial component), and $\bar{z}$ (plane-normal component). FIG. 10 shows the circuit board 30 after angular rotation through a pitch angle $\Phi$, but still with $\gamma=0°$ roll. In this orientation, the unit vectors are designated as $\bar{u}$ (radial), $\bar{v}$ (axial), and $\bar{w}$ (plane-normal component). It is then desired to transform, or reproject, measurements taken in the (u,v,w) coordinate system, into equivalent measurements in the (x,y,z) coordinate system.

The earth's magnetic field vector is designated as $\bar{g}$. The vector $\bar{g}$ can be expressed equally well in either coordinate system, namely, $$\bar{g} = g_1\bar{x} + g_2\bar{y} + g_3\bar{z} \tag{5a}$$

$$\bar{g} = g_1^*\bar{u} + g_2^*\bar{v} + g_3^*\bar{w} \tag{5b}$$

The relationship between measurements in the two coordinate systems is determined by a relatively straightforward technique. First, equation (5a) is utilized to obtain the projection of $\bar{g}$ onto the unit vector $\bar{x}$ in terms of the (x,y,z) coordinate system:

$$\bar{x}\cdot\bar{g}=\bar{x}\cdot g_1\cdot\bar{x}+\bar{x}\cdot g_2\cdot\bar{y}+\bar{x}\cdot g_3\cdot\bar{z}$$

Because $g_1$, $g_2$, and $g_3$ are scalars, the above equation is rewritten as $$\bar{x}\cdot\bar{g}=g_1\bar{x}\cdot\bar{x}+ee\ +g_2\text{fheight}\bar{x}\cdot\bar{y}+g_3+e,\text{ovs }\bar{x}\cdot\bar{z} \tag{6}$$

The (x,y,z) coordinate system unit vectors are mutually orthogonal. Thus, equation (6) simplifies to $$\bar{x}\cdot\bar{g}=g_1 \tag{6a}$$

Now equation (5b) is utilized to express the projection of $\bar{g}$ onto the unit vector $\bar{x}$ in terms of the (u,v,w) coordinate system $$\bar{x}\cdot\bar{g}=g_1{}^*\bar{x}\cdot\bar{u}+g_2{}^*\bar{x}\cdot\bar{v}+g_3{}^*\bar{x}\cdot\bar{2} \tag{7}$$

Equations (6a) and (7) are combined to obtain the result $$g_1=g_1{}^*\bar{x}\cdot\bar{u}+g_2{}^*\bar{x}\cdot\bar{v}+g_3{}^*\bar{x}\cdot\bar{w} \tag{8a}$$

Equations (5a) and (5b) are used to form similar projection of $\bar{g}$ onto unit vectors $\bar{y}$ and $\bar{z}$ to obtain the additional results $$g_2=g_1{}^*\bar{y}\cdot\bar{u}+g_2{}^*\bar{y}\cdot\bar{v}+g_3{}^*\bar{y}\cdot\bar{w} \tag{8b}$$

$$g_3=g_1{}^*\bar{z}\cdot\bar{u}+g_2{}^*\overline{z+ee}\cdot\bar{v}+g_3{}^*+e,\text{ovs }\bar{z}\cdot\bar{w} \tag{8c}$$

Equations (8a), (8b), and (8c) are important intermediate results demonstrating that readings in one coordinate system may be manipulated (transformed) into equivalent readings in another coordinate system. The details of the transformation are imbedded in the geometric relationships between the two coordinate systems as expressed by the dot products.

The general problem of determining the dot products is non-trivial for practical applications in which there is uncontrolled movement between the two coordinate systems. However, the requirement of a consistent roll angle simplifies the problem considerably, i.e., it forces the relationship $$\bar{x}=\bar{u} \tag{9}$$

The consistent roll relationship allows five of the nine dot products to be obtained by inspection:

$$\bar{x}\cdot\bar{u}=\bar{u}\cdot\bar{u}=1\ \ \bar{x}\cdot\bar{v}=\bar{u}\cdot\bar{v}=0\ \ \bar{x}\cdot\bar{w}=\bar{u}\cdot\bar{w}=0$$

$$\bar{y}\cdot\bar{u}=\bar{y}\cdot\bar{x}=0\ \ \bar{z}\cdot\bar{u}=\bar{z}\cdot\bar{x}=0$$

Figure 11:
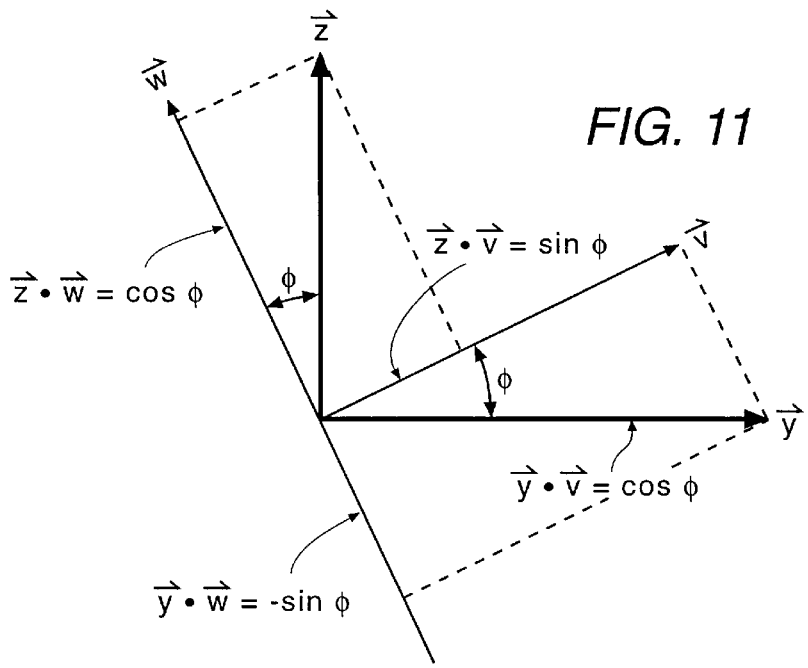
FIG. 11 is a graphical view of the pitch correction technique.

The remaining four dot products are developed in conjunction with the use of FIG. 11. FIG. 11 represents unit vectors $\bar{y}$ and $\bar{z}$ such that $\bar{y}$ is horizontal and $\bar{z}$ is vertical. Unit vectors $\bar{v}$ and $\bar{w}$ in the rotated coordinate system are displaced from $\bar{y}$ and $\bar{z}$ by the pitch angle $\Phi$. The required dot products are determined by trigonometry, as follows:

$$\bar{y}\cdot\bar{v}=\cos(\Phi)\ \ \bar{y}\cdot\bar{w}=-\sin(\Phi)$$

$$\bar{z}\cdot\bar{v}=\sin(\Phi)\ \ \bar{z}\cdot\bar{w}=\cos(\Phi)$$

Substituting the above dot products into equations (8a), (8b), and (8c) yields the desired relationships:

$$g_1=g_1{}^* \tag{10a}$$

$$g_2=g_2{}^*\cos(\Phi)-g_3{}^*\sin(\Phi) \tag{10b}$$

$$g_3=g_2{}^*\sin(\Phi)+g_3{}^*\cos(\Phi) \tag{10c}$$

Thus, sensor readings in the (u,v,w) coordinate system can be transformed into equivalent horizontal surface readings using the relationships given in equations (10a)–(10c). Data representative of the pitch angle $\Phi$ is required to perform actual numerical calculations, but this is not a problem as $\Phi$ is available directly from the pitch sensor 32.

Once reprojection calculations have been carried out to correct for nonzero pitch angles, equivalent mathematical operations may be employed to correct for nonzero roll angles. Let the roll angle as measured with respect to the local horizontal reference plane be $\gamma$ ($-90°<\gamma<+\pi°$) in a coordinate system requiring a consistent pitch angle $\Phi$. Employing vector mathematics similar to those immediately preceding, it is possible to obtain the relationships $$g_1=g_1{}^*\cos(\gamma)-g_3{}^*\sin(\gamma) \tag{11a}$$

$$g_2=g_2{}^* \tag{11b}$$

$$g_3=g_1{}^*\sin(\gamma)+g_3{}^*\cos(\gamma) \tag{11c}$$

As was the case with correction for nonzero pitch angle, sensor readings obtained below the surface of the earth can be transformed into equivalent horizontal surface readings using the relationships given in equations (11a)–(11c). The roll angle y is required in order to perform actual numerical calculations, but y is available directly from the roll sensor 18.

The reprojection of the coordinate system associated with the electronic compass 10 onto a reference plane of another coordinate state was described above in connection with the use of three magnetic field sensors 12, 18 and 24, and using additional sensors 32 and 34 to provide roll and pitch information for reprojection when the compass is not constrained horizontally, but is subject to additional degrees of motion, such as roll and pitch. Those skilled in the art may find it advantageous to obtain pitch and/or roll information from one or two of the magnetic field sensors 12, 18 and 24. In other words, the axial magnetic field sensor 12 may be utilized to not only provide signals of the magnetic field, but also provide information about the rotational position of the compass 10 about the roll axis 16. In order to resolve any ambiguity of different angular positions sensed by the various magnetic field sensors when utilized to determine pitch and/or roll, an initial starting position should be stored or remembered and then as the compass progresses through different orientations, the processor would carry a time history thereof so that after the initial condition was known, any angular change thereafter would also either be known or could be calculated. Although this alternative would reduce the number of sensors required, additional computational constraints would be placed on the processor.

In some applications, it is more convenient to display bearing deviation left or right from an initial or intended bearing, rather than to indicate absolute bearing relative to magnetic north. Bearing deviation can be calculated without requiring an intermediate computation of actual magnetic bearing, and the deviation calculation can result in a very efficient algorithm. In the following development, the intended bearing is understood to be the initial bearing at the beginning of a subsurface boring operation.

Begin with the trigonometric identity $$\tan(\alpha + \beta) = \frac{\tan\alpha + \tan\beta}{1 - \tan\alpha\tan\beta}, \quad (12)$$

where:
α is the original bearing (initial measurement),
β is the deviation from the original bearing, to be periodically determined, and
α+β represents the new bearing, the initial bearing plus deviation, as measured.

The terms in equation (12) may be rearranged to solve for the tangent of the bearing deviation, tan β, as follows:

$$\tan\beta = \frac{\tan(\alpha + \beta) - \tan\alpha}{1 + \tan\alpha\tan(\alpha + \beta)} \quad (13)$$

Assuming the initial measurements of the magnetic field are identified by INIT and the new determined measurements are identified by NEW, the following equations apply:

$$\tan\alpha = \frac{H_R(INIT)}{H_A(INIT)} \quad (14)$$

$$\tan(\alpha + \beta) = \frac{H_R(NEW)}{H_A(NEW)} \quad (15)$$

Substituting and solving for the deviation β, the result is:

$$\beta = \tan^{-1}\left[\frac{H_A(INIT)H_R(NEW) - H_A(NEW)H_R(INIT)}{H_A(INIT)H_A(NEW) + H_R(INIT)H_R(NEW)}\right] \quad (16)$$

The advantage of this result arises from the ability to compute bearing deviation directly from measurement values. $H_R(INIT)$ and $H_A(INIT)$ are initial radial and axial sensor readings, corrected to a horizontal reference plane, as determined at the start of the borehole. These readings are stored in a processor memory and are used for all subsequent calculations of bearing deviation during the formation of the particular borehole. $H_R(NEW)$ and $H_A(NEW)$ are new radial and axial sensor readings, corrected to a horizontal reference plane, as measured periodically as the boring tool advances. These $H_R(NEW)$ and $H_A(NEW)$ values will be periodically overwritten in the processor memory by each subsequent set of measurements.

As noted above, the calculation of the arctangent by an algorithm normally must be made within a limited angle relationship. By calculating bearing deviation directly in the equation above, this problem is generally avoided. It is generally rare to encounter deviations greater than ±45° from the intended bore path. Accordingly, a single bearing deviation algorithm based on a simple restricted-range arctangent algorithm should be useful in almost all cases.

Arctangent calculations can be made especially convenient by using a polynomial approximation to the arctangent function. A least squares fit may be used to approximate the arctangent function with output directly in degrees. If x is the argument from the equation for β above (ref. equation (16)), the true bearing deviation is approximated by a third order polynomial according to the relationship, where β is in degrees, $$\beta \neq 11.075x^3 + 55.7641x.$$

This equation expresses the bearing deviation β directly in degrees. Arctangent calculations normally return angles in radian measure, thus requiring a separate conversion algorithm to convert radian measure to degrees. The approximation above differs from the true arctangent by no more than about ±0.30 over the range of ±450.

At the expense of additional inaccuracy, a further simplification using a first order or linear least-squares approximation provides the equation β=48.4766x, where β is also given directly in degrees. Lookup tables and linear interpolation schemes are other possibilities for minimizing the computational burden.

Figure 12:
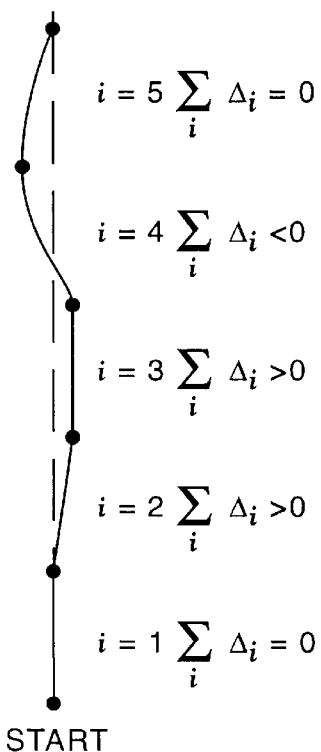
FIG. 12 is a drawing illustrating a path of travel of a vehicle incorporating the electronic compass to estimate cumulative lateral error.

Clearly, bearing deviation may also be calculated by first computing the current absolute magnetic bearing and then finding the difference between the intended magnetic bearing and the current magnetic bearing. Note that a 0° bearing deviation does not indicate that the current trajectory is exactly on the intended path; rather, a 0° bearing deviation indicates that the current trajectory is exactly parallel to the intended path. As a further refinement to the invention, it is desirable to account for the possibility of error accumulation as an indication of the lateral deviation to be expected at the exit or destination point. As shown in FIG. 12, the total lateral error is dependent on the accumulated bearing deviations as measured periodically during the formation of the borehole.

It is assumed for the following purposes that bearing derivation readings are made at consistent intervals during the boring operation—for example, every 10 feet. Under these circumstances, lateral deviation may be predicted by accumulating (summing) the tangents of the angular bearing deviations observed at each measurement interval. That is, if the angular bearing deviation at the $i^{th}$ interval is $\alpha_i$, the tangent of the angular bearing deviation is denoted by $\Delta_i$, that is, $\Delta_i = \tan\alpha_i$. Then, the bore trajectory will identically follow the intended bore path as long as the accumulated angular bearing deviation tangents satisfy the relationship:

$$\sum_i \Delta_i = 0 \quad (17)$$

Clearly, the accumulated sum of angular bearing deviation tangents is an important quantity for determining whether or not the borehole is proceeding along the intended trajectory or path. Stated another way, by accumulating the sum of the angular bearing derivation tangents, it can be readily ascertained whether the boring tool is coaxial with the intended path, rather than only parallel to the path. Specific computational elements and circuits are included in the preferred embodiment of the invention for the purpose of making the necessary calculations and displaying the result to the operator. For example, the set of three magnetic sensors 12, 18 and 24 can be mounted to the boring tool 40. The readings or measurements from the sensors can be processed by a processor and modulated on a carrier for transmission to surface-located receiver equipment. The surface equipment then demodulates the carrier, decodes the results and provides a visual display of the directional bearing, deviation, etc. In vehicular application, the modulation and transmission may not be necessary, as the data can be transferred over a conductor to an instrument panel processor or a visual display.

In either underground boring application, or in land and air vehicles, the degree of deviation displayed to an operator can be utilized to manually change the actual direction of travel to reduce the error and coincide with the intended path of travel. In more sophisticated systems, the deviation error can be used to automatically change the actual direction of travel so that there is coincidence with the intended path of travel. Of course, the change in the actual direction of travel can be carried out at predefined rates using proportional-integral-derivative techniques well known in the art for bringing process variables into alignment with desired criteria.

While lateral deviations are highly important in underground boring operations, vertical or other directional deviations may be equally important in other applications. For example, in aircraft guidance systems it is often highly important to maintain a given altitude. Therefore, vertical deviations from a given altitude are of paramount importance. Aircraft landing under instrument flight conditions are often required to maintain a flight path with limited deviation in both the vertical and horizontal directions. As such, the electronic compass of the invention would perform calculations to determine both the vertical and horizontal bearing deviations from an intended flight path. When used in aircraft applications, the processor may not provide visual indications in a digital readout form, but may provide a deflection of an indicator needle or arrow. Further, the deviation output of the electronic compass may be provided as an input to autopilot instrumentation to automatically correct the flight path of the aircraft.

The foregoing developments have been undertaken with the objective of obtaining the greatest possible precision from the basic directional bearing calculation utilizing the arctangent expression given in equation (1). Certainly, this is mathematically correct and, when employing floating-point processors or other computational elements with substantial computational capability, equation (1) may be employed with a great degree of accuracy. In some applications, especially those in which power consumption is a major consideration, computational modules, elements and circuits with lower power consumption and limited floating-point capability or integer arithmetic may be required. In such circumstances, the accuracy of the arctangent approximation implicit in equation (1) can be improved upon by exploiting the relatively improved sensitivities available using arcsine and arccosine approximations.

Figure 13:
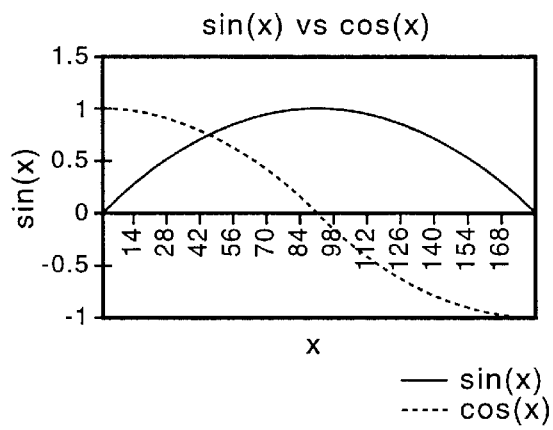
FIG. 13 graphically illustrates the determination of directional bearing using sine and cosine calculations.

Referring to FIG. 13, there is illustrated sin(x) and cos(x) functions over the range of 0° to 180°. The horizontal axis of the graph (x-axis) indicates the angles from 0° to 180°, while the vertical axis (y-axis) represents the amplitudes of the functions sin(x) and cos(x). The solid line in the graph of FIG. 13 represents the sine function of the angles, while the broken line represents the cosine function. It is evident that the relative sensitivities of sin(x) and cos(x) are functions of the angles. That is, deviations around an angle of 15° elicit a much more significant change in the sin(x) function than in the cos(x) function. Thus, when the deviation is in the neighborhood of 15°, the sin(x) function should be utilized as it is more accurate than the cos(x) function. Advantage may be taken of this effect by a sorting algorithm which routes the argument $x = H_R/H_A$ into either an arcsine or arccosine algorithm to maximize accuracy.

Figure 14:
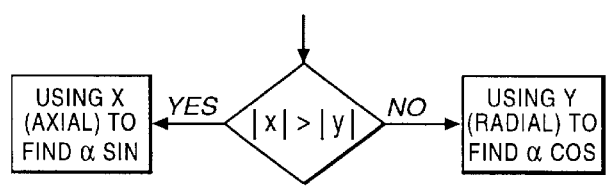
FIG. 14 is a simplified flow chart illustrating a sorting algorithm for selecting the sine or cosine calculation of FIG. 13.

The simple sorting algorithm shown in FIG. 14 selects either the sine or cosine algorithm to thereby provide the best available angular accuracy with limited-precision arithmetic. The use of the sorting algorithm according to the invention can be understood by reference to FIG. 6 where the various magnetic components are illustrated, it being understood that the axial sensor 12 (FIG. 1) measures the axial magnetic component $H_A$ and the radial sensor 18 measures the radial magnetic component $H_R$. While both magnetic sensors 12 and 18 are necessary to measure the magnitude of the magnetic field H, either of the sensors (radial or axial) can be selected to measure the angle Φ. Either the axial sensor 12 or the radial sensor 18 is selected, based on the general directional bearing between 0° and 180°. In FIG. 13, the axial sensor 12 corresponds to the solid line of the graph, while the radial sensor 18 corresponds to the broken line. It is apparent that between about 45° and 135°, the radial sensor 18 is more sensitive to angular measurements, while between about 0° and 45° and between about 135° and 180° the axial sensor 12 is more sensitive to angular measurements. Thus, although both sensors 12 and 18 are required to obtain the magnitude of the magnetic vector, the sorting algorithm of FIG. 14 can be utilized to select the more sensitive magnetic sensor 12 or 18 to provide accurate angular output measurements. In FIG. 14, |y| corresponds to the measurement of the absolute magnitude of the axial sensor 12 and |x| corresponds to the absolute magnitude of the radial sensor 18. While both the axial and radial sensors will be providing outputs of magnetic field magnitude, only one is selected, based on the instantaneous orientation of the electronic compass between 0°–180° to provide output angle information.

The same type of sorting algorithm can be utilized when the electronic compass 10 is subject to constant roll or pitch. In either of these situations, depending on the particular angular orientation at that time, the output is selected from one magnetic sensor, and as the compass continues to roll or pitch, the output of another magnetic sensor is selected. For situations where the magnetic compass is utilized in a continuous roll situation, such as underground boring tools, the radial magnetic sensor 18 will be selected for a portion or arc, such as for about 45° of the roll, and then the plane-normal magnetic sensor 24 will be selected for the subsequent 45° arc of the roll to provide output roll information. The selection between the radial 18 and plane-normal sensor 24 will alternate about every 45° to provide a greater degree of sensitivity to the measurement of the external magnetic field during partial or full rotations of the magnetic compass 10 about the axial axis 16.

When the electronic compass 10 is subject to large pitch angle movements about the radial axis 20, then output selection can be carried out in a similar manner by the processor 84 between the axial magnetic sensor 32 and the plane-normal magnetic sensor 24. In this manner, compass pitch angle rotational movements can be optimized as to accuracy to provide a more reliable and accurate compass. Indeed, when the electronic compass 10 undergoes rotational movement about an axis that is not co-linear with either the radial axis 20 or the axial axis 16, different combinations of the magnetic sensor outputs can be selected in real time to provide instantaneous directional bearing information.

Although various embodiments of the invention have been illustrated in the accompanying drawings and described in the foregoing detailed description, it will be understood that the principles and concepts of the invention are not limited to the embodiments disclosed, but are capable of numerous other rearrangements, modifications, and substitutions of parts and elements without departing from the spirit and scope of the invention, as defined by the appended claims.

What is claimed is:

1. An electronic compass providing a directional bearing, comprising:

a base for mounting thereto in a mutually orthogonal relationship, a first, second and third magnetic field sensor, said first and second magnetic field sensors arranged for measuring respectively orthogonal magnetic field components in a plane associated with the electronic compass;

said third magnetic field sensor arranged for measuring a magnetic component of the magnetic field orthogonal to the plane determined by the first and second sensors;

a roll sensor for sensing angular roll orientations of said electronic compass about an axis aligned in a direction of intended travel and for providing output roll angle data; and a programmed processor for calculating a vertical magnetic field component in conjunction with the measured magnetic field components of the first and second magnetic field sensors and programmed for reprojecting the measured first and second magnetic field components onto a reference plane using said roll angle data to thereby remove effects of roll orientations of the electronic compass on the measured magnetic field components.

2. The electronic compass of claim 1, wherein the processor is programmed to carry out a dot product of measured magnetic field components with respect to dimensional magnetic vectors of a three-dimensional coordinate system.

3. The electronic compass of claim 2, wherein the processor is programmed to carry out said dot products with respect to a pair of three-dimensional coordinate systems, where one coordinate system is rotated about a common axis with respect to the second coordinate system.

4. The electronic compass of claim 3, wherein said pair of coordinate systems have respective axes (X, Y, Z) and (U, V, W) and where the earth's magnetic field components are $g_1$, $g_2$ and $g_3$ in the first coordinate system and $g_1^*$, $g_2^*$ and $g_3^*$ are the magnetic field components in the second coordinate system, and wherein said processor is programmed to carry out the calculations:

$$g_1 = g_1^* \bar{x} \cdot \bar{u} + g_2^* \bar{x} \cdot \bar{v} + g_3^* \bar{x} \cdot \bar{w}$$

$$g_2 = g_1^* \bar{y} \cdot \bar{u} + g_2^* \overline{\bar{y} + ee \cdot \bar{v} + g_3^* + e,ovs \, \bar{y} \cdot \bar{w}}$$

$$g_3 = g_1^* \bar{z} \cdot \bar{u} + g_2^* \bar{z} + \bar{v} + g_3^* \bar{z} \cdot \bar{w}.$$

5. The electronic compass of claim 4, wherein said processor is programmed to carry out the following calculations:

$$g_1 = g_1^*$$

$$g_2 = g_2^* \cos(\Phi) - g_3^* \sin(\Phi)$$

$$g_3 = g_2^* \sin(\Phi) + g_3^* \cos(\Phi)$$

where $\Phi$ is a pitch angle of a base of the electronic compass with respect to the reference plane.

6. The electronic compass of claim 4, wherein said process is programmed to carry out the following calculations:

$$g_1 = g_1^* \cos(\gamma) - g_3^* \sin(\gamma)$$

$$g_2 = g_2^*$$

$$g_3 = g_1^* \sin(\gamma) + g_3^* \cos(\gamma)$$

where $\gamma$ is a non-zero roll angle of the base of the electronic compass with respect to a reference plane.

7. The electronic compass of claim 1, wherein said processor is programmed to calculate an original directional bearing of the electronic compass using the first, second and third measured magnetic field components, and thereafter to calculate a deviation of the electronic compass from the original directional bearing, by calculating:

$$\beta = \tan^{-1}[H_A(INIT)H_R(NEW) - H_A(NEW)H_R(INIT)/H_A(INIT)H_A(NEW) + H_R(INIT)H_R(NEW)]$$

where $\beta$ is the deviation from the original bearing to be periodically determined, $H_A$ and $H_R$ are respective axial and radial magnetic field component measurements, respectively, corrected to the reference plane; and INIT is an original measurement at a beginning; and
NEW is a series of subsequent measurements.

8. The electronic compass of claim 7, wherein said processor is programmed to carry out said deviation using an arctangent function.

9. The electronic compass of claim 8, wherein said processor is programmed to carry out arctangent functions using a polynomial approximation.

10. The electronic compass of claim 9, wherein said processor is programmed to calculate said polynomial approximation to obtain a direct result in degrees.

11. The electronic compass of claim 8, wherein said processor is programmed to carry out said arctangent function using a first order linear equation.

12. The electronic compass of claim 8, wherein said processor is programmed to periodically determine the directional bearing and accumulate tangents of the bearing deviation from a desired directional bearing.

13. The electronic compass of claim 12, wherein said processor is programmed to calculate and display accumulated tangents of the bearing deviation from the desired directional bearing.

14. The electronic compass of claim 1, wherein said processor i programmed to select between an arcsine and an arccosine function in determining a directional bearing.

15. The electronic compass of claim 1, wherein said first, second and third magnetic field sensors comprise magnetoresistive sensors.

16. The electronic compass of claim 15, further including a pitch sensor for sensing angular deviations of pitch of said electronic compass from the reference plane.

17. The electronic compass of claim 16, wherein said roll and pitch sensors comprise accelerometers.

18. The electronic compass of claim 1, wherein said roll sensor comprises a pair of roll sensors mounted orthogonally to each other to provide increased sensitivity to roll angle determinations.

19. The electronic compass of claim 18, wherein said processor is programmed to selectively utilize measurements from one or another of said pair of roll sensors as a function of instantaneous angular roll positions of the electronic compass.

20. The electronic compass of claim 16, wherein said pitch angle sensor comprises a ferrofluid sensor.

21. The electronic compass of claim 1, wherein said processor is programmed to correct sensor measurement data by using predefined offset compensation parameter data stored in a memory.

22. The electronic compass of claim 1, wherein said processor is programmed to correct sensor measurement data by using predefined gain variation data stored in a memory.

23. A method of calculating a directional bearing of a movable object using an electronic compass, comprising the steps of:

mounting the electronic compass to the object;

fixing an axial component magnetic field sensor and radial component magnetic field sensor orthogonally with respect to each other so as to prevent relative movement of said sensors;

mounting a pitch angle sensor and a roll angle sensor orthogonally with respect to each other;

mounting a processor and memory for receiving magnetic field measurement data, angular roll data and angular pitch data from the respective sensors; and programming the processor to process the magnetic field measurement data and the angular roll and pitch data to provide an output defining compass rose indications of directional bearing.

24. The method of claim 23, further including programming the processor to carry out arctangent calculations on the magnetic field measurement data.

25. The method of claim 23, farther including programming the processor to carry out calculations to reproject axial and radial magnetic field measurement data onto a reference plane using the plane-normal magnetic field measurement data.

26. The method of claim 25, further including programming said processor to carry out calculations for rotating a first coordinate system associated with the electronic compass with respect to a second coordinate system according to an angle computation algorithm.

27. The method of claim 26, further including programming the processor to calculate an arctangent function and using said coordinate system rotation to thereby result in angular data between about −45 degrees and about +45 degrees.

28. The method of claim 26, further comprising the step of selecting between a pair of coordinate systems at a predetermined angle relative to each other to insure that the angle calculated is within the range of about −45° to about +45°.

29. The method of claim 26, further comprising the step of storing in a memory a record of the first magnetic field component through at least one full rotation about an axis of rotation in a horizontal plane, and averaging the measured first magnetic field component at two points 180° apart about the axis of rotation to eliminate effects of pitch angle on the measurement.

30. The method of claim 29, further comprising the step of storing the measurement of the second magnetic field component for at least one complete rotation about the axis of rotation in a horizontal plane simultaneously with the recording of the first magnetic field component and determining a point in time when the influence of the pitch angle on the first magnetic field component is effectively zero, and calculating the second magnetic field component independent of the pitch angle by calculating the sine of the angle between the predetermined point in time and the angle of next succeeding maximum second magnetic field component.

31. The method of claim 23, further including computing a deviation of the electronic compass from an initial directional bearing without computing an actual directional bearing subsequent to the initial directional bearing.

32. An electronic compass, comprising:
a radial, axial and plane-normal magnetic field component sensor, each mounted orthogonal to each other to measure respective X, Y and Z magnetic field components of the earth's magnetic field;
a roll angle sensor fixed in a predefined orientation with respect to said magnetic field component sensors, for measuring roll angle displacements of the electronic compass with respect to a reference plane;
a pitch angle sensor for measuring pitch angles of the electronic compass with respect to the reference plane;
an AID converter for converting analog measurements of the sensors to respective digital data; and
a programmed processor for receiving the digital data and for processing the measured magnetic field components to correct for angular pitch and roll displacements of said electronic compass from the reference plane, and for providing output indications of directional bearing from 0–360 degrees of a compass rose.

33. The electronic compass of claim 32, wherein said processor is programmed to process radial and axial magnetic fields as measured by the respective radial and axial sensors, and reproject the measured radial and axial magnetic field components onto a reference plane, and programmed to process the magnetic field components reprojected on the reference plane to determining a magnetic bearing that is corrected for said pitch and roll displacement of the magnetic compass.

34. The electronic compass of claim 32, wherein said magnetic field component sensors each comprise a magnetoresistive bridge sensor.

35. The electronic compass of claim 32, wherein said radial magnetic sensor and said roll angle sensor are mounted with coaxial sensitivity axes.

36. The electronic compass of claim 32, wherein the roll angle and the pitch angle sensors comprise accelerometers.

37. The electronic compass of claim 32, wherein said pitch angle sensor comprises a ferrofluid pitch sensor having a container partially filled with a ferrofluid and a pair of electromagnetic coils disposed around the container for sensing pitch angles of the electronic compass that are independent of roll angles thereof.

38. The electronic compass of claim 32, further including in combination an underground boring tool to which said electronic compass is fixed.

39. The electronic compass of claim 32, further including in combination a passenger vehicle to which said electronic compass is fixed.

40. The electronic compass of claim 32, wherein said processor is programmed to provide output indications of deviation from a desired path of travel of the electronic compass.

41. The electronic compass of claim 32, wherein said processor comprises an integer arithmetic processor programmed to carry out an algorithm for calculating arctangent functions.

42. The electronic compass of claim 32, wherein said roll angle sensor comprises a pair of sensors orthogonally mounted with respect to each other, and said processor is programmed to selectively sample roll angle measurements of said pair of sensors as a function of the roll angle displacement of the electronic compass about an axis of rotation.

43. An electronic compass, comprising:
a circuit board for mounting thereto electronic components;
an axial, radial and plane-normal magnetoresistive sensor mounted to said circuit board, each said sensor mounted with a magnetic sensitive axis thereof orthogonal to each other according to a three-axis coordinate system, said sensors each providing respective output axial, radial and plane-normal analog signals representative of a magnetic field component associated with a respective axis of the coordinate system;
a roll sensor mounted to said circuit board and responsive to roll orientations of angular movement of the electronic compass about an axis of the circuit board, said roll sensor providing output indications of the extent of roll of said electronic compass;
an analog-to-digital (A/D) converter for converting output analog signals of said magnetoresistive sensors and said roll sensor, and providing corresponding output digital signals; and
a processor for receiving the digital signals from the A/D converter and programmed to calculate an axial, radial and plane-normal magnetic field component of an external magnetic field with respect to the coordinate system, and programmed to reproject the axial, radial and plane-normal components of the coordinate system into another three-axis coordinate system using output indications of said roll sensor, and programmed to determine a directional bearing of the electronic compass with respect to said external magnetic field.

44. The electronic compass of claim 43, further including a pitch sensor mounted to said circuit board and responsive to pitch orientations of angular movements of the electronic compass about an axis of said circuit board.

45. The electronic compass of claim 43, wherein said axial; radial and plane-normal magnetoresistive sensors are each fixed to said circuit board so as to be prevented from movement with respective to each other.

46. The electronic compass of claim 43, further including a sorting program utilized by said processor for sequentially selecting between one said magnetic sensor and another said magnetic sensor an output thereof as a function of a respective angular position of one said sensor and the other sensor.

47. The electronic compass of claim 43, further including a program utilized by said processor for calculating a deviation of the electronic compass from a desired path by periodically accumulating tangents of bearing deviations from an intended path.

48. The electronic compass of claim 47, further including a program utilized by said processor for calculating an initial magnetic bearing and thereafter accumulating subsequent tangents of bearing deviations as a function of said initial magnetic bearing.

49. A method of constructing an electronic compass for underground boring, comprising the steps of:
mounting a magnetoresistive magnetic field measuring arrangement including an axial, a radial and a plane-normal magnetic field sensor so that a respective sensitive axis thereof is orthogonal to each other and corresponds to a three-axis coordinate system associated with the electronic compass;
mounting a roll measuring sensor to said magnetic field measuring arrangement;
fixing the magnetic field measuring arrangement to an underground boring tool so that the magnetic field measuring arrangement undergoes the same linear and angular movements as does said boring tool; coupling an analog-to-digital (A/D) converter to said magnetoresistive sensor arrangement and to said roll sensor to convert analog signals to corresponding digital signals, and
programming a processor to process the digital signals to determine a first directional bearing as a function of the radial and axial magnetoresistive sensors, and processing the digital signals of the plane-normal magnetoresistive sensor and the roll measuring sensor to provide a second directional bearing corrected for effects of a roll angle of the boring tool that is different from a reference roll angle.

50. The method of claim 49, further including a pitch measuring sensor for measuring a pitch angle of the boring tool that is different from a reference pitch angle, converting analog pitch angle signals to corresponding digital signals, and further including programming said processor to process the first directional bearing with the pitch angle digital signals to provide said second directional bearing corrected for a pitch angle of the boring tool that is different from the reference pitch angle.

51. The method of claim 49, further including programming said processor so that measured radial and axial magnetic field components are reprojected onto a reference plane by carrying out a mathematical algorithm.

52. The method of claim 49, further including programming the processor with a program to select the signals from one of two of said magnetoresistive sensors during rotation of said boring tool about an axis to optimize accuracy of the electronic compass.

53. The method of claim 49, further including mounting a plurality of sensors for measuring roll angles of the boring tool, and alternately selecting said roll angle sensors as a function of an angular position of the boring tool and processing the output signals of the selected roll angle sensor to optimize accuracy of the electronic compass.

54. The method of claim 49, further including programming the processor with software for determining a deviation of the boring tool from an intended path, and providing outputs of the boring tool indicating said deviation.

55. The method of claim 54, further including programming said processor to determine an initial directional bearing and thereafter summing at periodic intervals the tangents of deviations of the boring tool from the intended path.

56. The method of claim 55, further including programming the processor to provide outputs of deviation to an operator of the boring tool.

57. The method of claim 55, further including programming the processor to compare an initial bearing direction with the summed deviation and providing output signals for correcting the directional movement of the boring tool to thereby allow the tool to follow the intended path.

58. A method of measuring deviation of an object from an intended path using an electronic compass, comprising the steps of:
storing in a memory of the electronic compass a parameter of an intended path indicating a desired directional bearing;
measuring at periodic times during movement of the object a deviation of the object from the intended path;
processing the measured deviation at the periodic times and summing the measured deviations; and
comparing the summed deviations with the stored parameter and providing output signals for indicating deviation of the object from said intended path.

59. The method of claim 58, further including measuring a radial magnetic field component and an axial magnetic field component of the intended path and calculating an intended directional bearing and correcting the calculated directional bearing to a reference plane and storing the corrected intended bearing as said parameter.

60. The method of claim 59, further including correcting the calculated intended directional bearing for at least one of a roll or a pitch difference from the reference plane.

61. The method of claim 58, further including calculating the intended path only once at an initial position of the object at a start of the intended path, and not thereafter during traversal of the intended path.

62. The method of claim 58, further including calculating $\beta$ by processing measured deviation parameters according to:

$$\beta = \tan^{-1}\left[ \frac{H_A(INIT)H_R(NEW) - H_A(NEW)H_R(INIT)}{H_A(INIT)H_A(NEW) + H_R(INIT)H_R(NEW)} \right] \quad (16)$$

where $H_A$ defines a measured axial magnetic field, $H_R$ defines a measured radial magnetic field, (NEW) defines $H_A$ and $H_R$ measurements taken during traversal of the intended path, and (INITIAL) defines initial measurements of $H_A$ and $H_R$ taken at a start position of the intended path.

63. The method of claim 62, further including summing bearing deviations along traversal of the actual path of the object by calculating:

$$\sum_i \Delta_i = 0 \tag{17}$$

where $\Delta_i$ is the tangent of the measured angular deviation at each said periodic time, and where a difference of the summation from zero indicates the extent of the accumulated lateral deviation.

64. The method of claim 58, further including measuring a vertical deviation of the object from an intended path.

65. The method of claim 62, wherein said deviation defines a lateral deviation from said intended path, and further including measuring a vertical deviation from said intended path.

66. The method of claim 64, further including providing an indication to an operator of the object of the horizontal deviation and the vertical deviation from the intended path.

67. The electronic compass of claim 1, further including only a single set of said first, second and third magnetic field sensors for providing data to said programmed processor.

68. The electronic compass of claim 1, wherein said processor is programmed to dynamically obtain magnetic field component measurement information and make corrections thereto based on the output roll angle data.

69. The electronic compass of claim 1, wherein said first, second and third magnetic field sensors are fixed to prevent relevant movement therebetween.

70. The electronic compass of claim 16, wherein said first, second and third magnetic field sensors and said roll sensor and said pitch sensor are fixed to prevent relevant movement therebetween.

71. The method of claim 74, further including fixing the radial and axial magnetic field sensors to prevent any movement thereof with respect to said underground boring tool.

72. A method of providing a directional bearing using an electronic compass, comprising the steps of:

mounting axial, radial and plane-normal magnetic field sensors so as to be immovable with respect to each other and undergo the same movements as said electronic compass;

providing a pitch and roll sensor with said electronic compass to sense pitch and roll movements of said electronic compass from respective zero-pitch and zero-roll references;

programming a processor with an algorithm to process axial, radial and plane-normal magnetic field data as measured by said axial, radial and plane-normal magnetic field sensors;

programming said processor to reproject measured axial and radial magnetic field components onto a reference plane when said electronic compass experiences an orientation departing from said zero-pitch and zero-roll references; and processing reprojected axial magnetic field and reprojected radial magnetic field component data according to a programmed algorithm to provide a directional bearing corrected for any departure of movements of said electronic compass from said zero-pitch or zero-roll references.

73. The method of claim 72, further including programming said processor to calculate deviations of said electronic compass from an intended directional bearing and provide output indications thereof.

74. The method of claim 72, further including providing only five sensors, each to measure a respective axial, radial, plane-normal, magnetic field component and respective roll and pitch orientations of said electronic compass.

* * * * *